United States Patent
Priewasser

(10) Patent No.: US 11,823,941 B2
(45) Date of Patent: Nov. 21, 2023

(54) METHOD OF PROCESSING A SUBSTRATE

(71) Applicant: DISCO Corporation, Tokyo (JP)

(72) Inventor: Karl Heinz Priewasser, Munich (DE)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/939,987

(22) Filed: Jul. 27, 2020

(65) Prior Publication Data

US 2021/0035846 A1    Feb. 4, 2021

(30) Foreign Application Priority Data

Aug. 1, 2019 (DE) ...................... 10 2019 211 540.3

(51) Int. Cl.
| | | |
|---|---|---|
| *H01L 21/683* | (2006.01) | |
| *H01L 21/268* | (2006.01) | |
| *H01L 21/304* | (2006.01) | |
| *H01L 21/78* | (2006.01) | |
| *H01L 21/66* | (2006.01) | |
| *H01L 23/544* | (2006.01) | |

(52) U.S. Cl.
CPC ........ *H01L 21/6836* (2013.01); *H01L 21/268* (2013.01); *H01L 21/304* (2013.01); *H01L 21/78* (2013.01); *H01L 22/20* (2013.01); *H01L 23/544* (2013.01); *H01L 2221/68327* (2013.01); *H01L 2223/5446* (2013.01); *H01L 2223/54426* (2013.01)

(58) Field of Classification Search
CPC .... H01L 21/6836; H01L 21/78; H01L 21/268
See application file for complete search history.

(56) References Cited

U.S. PATENT DOCUMENTS

| | | | | |
|---|---|---|---|---|
| 2005/0170613 A1* | 8/2005 | Murata | ............... | H01L 21/6836 438/460 |
| 2005/0260829 A1* | 11/2005 | Uematsu | ............. | H01L 21/3043 438/460 |
| 2007/0111480 A1* | 5/2007 | Maruyama | ............. | B23K 26/18 257/E21.599 |
| 2007/0111483 A1* | 5/2007 | Maruyama | ............. | B23K 26/40 438/464 |

(Continued)

FOREIGN PATENT DOCUMENTS

| | | |
|---|---|---|
| JP | 04180650 A | 6/1992 |
| JP | 2001345300 A | 12/2001 |

(Continued)

*Primary Examiner* — Brian Turner
(74) *Attorney, Agent, or Firm* — Greer Burns & Crain Ltd.

(57) ABSTRACT

A substrate having a first side and a second side opposite the first side is processed by providing a protective film having a front surface and a back surface opposite the front surface and providing a holding frame for holding the substrate. The holding frame has a central opening. The holding frame is attached to the back surface of the protective film so as to close the central opening of the holding frame by the protective film, and the first side of the substrate or the second side of the substrate is attached to the front surface of the protective film. The substrate is processed from the side of the substrate which is opposite the side of the substrate attached to the front surface of the protective film, and/or the side of the substrate which is attached to the front surface of the protective film.

12 Claims, 5 Drawing Sheets

(56) References Cited

U.S. PATENT DOCUMENTS

| | | | |
|---|---|---|---|
| 2008/0023149 A1* | 1/2008 | Yamamoto | H01L 21/67132 |
| | | | 156/515 |
| 2014/0315372 A1* | 10/2014 | Nakamura | H01L 21/78 |
| | | | 438/462 |
| 2014/0339673 A1* | 11/2014 | Shoichi | H01L 21/6836 |
| | | | 438/464 |
| 2015/0056727 A1* | 2/2015 | Yamashita | G01R 1/0491 |
| | | | 324/756.01 |
| 2018/0005862 A1* | 1/2018 | Priewasser | H01L 21/78 |
| 2018/0151508 A1* | 5/2018 | Nakamura | H01L 21/6836 |
| 2018/0337141 A1* | 11/2018 | Priewasser | H01L 21/02013 |
| 2020/0075311 A1* | 3/2020 | Osaga | H01L 21/76862 |
| 2020/0075382 A1* | 3/2020 | Hayashishita | H01L 21/683 |
| 2021/0134647 A1* | 5/2021 | Kamphuis | H01L 21/67132 |

FOREIGN PATENT DOCUMENTS

| | | | |
|---|---|---|---|
| JP | 2002270560 A | 9/2002 | |
| JP | 2005332982 A | 12/2005 | |
| JP | 2014216344 A | 11/2014 | |
| JP | 2019021808 A | 2/2019 | |
| JP | 2019125785 A | 7/2019 | |
| KR | 1020190021440 A | 3/2019 | |
| WO | 2015190479 A1 | 12/2015 | |
| WO | 2018210426 A1 | 11/2018 | |

* cited by examiner

METHOD OF PROCESSING A SUBSTRATE

TECHNICAL FIELD

The present invention relates to a method of processing a substrate, such as a wafer, e.g., a semiconductor wafer.

TECHNICAL BACKGROUND

The processing of a substrate, such as a wafer, requires safe and reliable handling and transport of the substrate, e.g., inbetween and during processing steps. For example, in a device fabrication process, e.g., for producing semiconductor devices, a substrate, such as a wafer, having a device area with a plurality of devices, commonly partitioned by a plurality of division lines, is divided into individual chips or dies. This fabrication process generally comprises a grinding step for adjusting the substrate thickness and a cutting step of cutting the substrate along the division lines to obtain the individual chips or dies. The grinding step is performed from a back side of the substrate which is opposite to a substrate front side on which the device area is formed. Moreover, also other processing steps, such as polishing and/or etching, may be carried out on the back side of the substrate. The substrate may be cut along the division lines from its front side or its back side.

In order to protect the substrate, in particular, devices formed on the substrate, e.g., from breakage, deformation and/or contamination by debris, grinding water or cutting water, during processing of the substrate, a protective film or sheeting may be applied to the front side of the substrate prior to processing.

Also, a protective film or sheeting may be applied to the back side of the substrate before processing, in order to protect the substrate, e.g., from breakage, deformation and/or contamination by debris, for example, during a step of cutting the substrate.

In order to facilitate handling and transport of the substrate, for example, inbetween and/or during the above processing steps, a holding frame for holding the substrate may be used. Conventionally, such a holding frame is attached to the protective film on the same side of the film as the substrate by means of an adhesive. Commonly, the same adhesive layer is used for attaching the substrate and the holding frame to the protective film.

The above-identified known approach of arranging substrate and holding frame on the same side of the protective film can cause problems during substrate processing. In particular, the holding frame may, at least partly, obstruct or impede access to the substrate by the processing equipment, such as cutting, grinding or polishing means, thus interfering with substrate processing. Further, there is a risk of this equipment being damaged due to unintentional contact with the holding frame.

To alleviate these problems, the holding frame may be clamped down so as to be moved away from the surface of the substrate to be processed. However, this approach requires the use of a clamp down mechanism for the frame which is space consuming and renders substrate processing considerably more cumbersome and complicated. Moreover, the protective film must exhibit a high degree of expandability for enabling sufficient clamping down of the frame, thus significantly limiting the range of usable protective films.

Also, in order to allow the required amount of movement of the holding frame relative to the substrate during the clamping down process, a sufficiently large portion of the protective film has to be present between an inner circumference of the frame and an outer circumference of the substrate. Hence, a frame with a large inner diameter has to be used, thereby aggravating the above space consumption problem and restricting the range of usable holding frames.

The above-identified problems are particularly pronounced for holding frames with a large thickness, e.g., plastic frames. In this case, the frames have to be clamped down to an especially high degree in order to ensure that they do not interfere with processing the substrate.

Further, attaching the holding frame to the protective film in the above-identified conventional manner, using an adhesive layer, may cause further problems. In particular, when detaching the frame from the protective film, the frame may be damaged by the adhesive force of the adhesive layer and/or be contaminated by adhesive residues. Such adhesive residues may have to be removed from the frame in order to allow for the frame to be reused, thus further complicating the substrate processing procedure.

Hence, there remains a need for a simple and efficient method of processing a substrate.

SUMMARY OF THE INVENTION

Accordingly, it is an object of the present invention to provide a simple and efficient method of processing a substrate. This goal is achieved by a substrate processing method with the technical features of claim 1 and by a substrate processing method with the technical features of claim 12. Preferred embodiments of the invention follow from the dependent claims.

The invention provides a method of processing a substrate having a first side, e.g., a front side, and a second side, e.g., a back side, opposite the first side. The method comprises providing a protective film or sheet having a front surface and a back surface opposite the front surface and providing a holding frame for holding the substrate. The holding frame has a central opening. The method further comprises attaching the holding frame to the back surface of the protective film or sheet so as to close the central opening of the holding frame by the protective film or sheet and attaching the first side of the substrate or the second side of the substrate to the front surface of the protective film or sheet. Moreover, the method comprises processing the substrate from the side of the substrate which is opposite the side of the substrate attached to the front surface of the protective film or sheet and/or processing the substrate from the side of the substrate which is attached to the front surface of the protective film or sheet.

In the method of the invention, the holding frame is attached to the back surface of the protective film and the first side or the second side of the substrate is attached to the front surface of the protective film. Hence, the holding frame and the substrate are attached to opposite sides of the protective film. Therefore, it can be reliably ensured that the holding frame does not interfere with substrate processing. The substrate can be accessed freely by processing equipment, such as cutting, grinding or polishing means. Further, any risk of this equipment being damaged due to unintentional contact with the holding frame can be reliably eliminated.

Hence, no clamping down of the frame during substrate processing is required, so that the substrate can be processed in a particularly simple and efficient manner. Since, thus, no clamp down mechanism is needed, the method of the invention allows for substrate processing within limited processing space. For example, rather than space consuming in-line equipment, stand-alone processing apparatuses can be used for this purpose.

Moreover, no protective films with high expandability or holding frames with large inner diameter have to be employed. Thus, a wide range of protective films and holding frames is applicable for the processing method of the invention.

Therefore, the present invention provides a simple and efficient method of processing a substrate.

The holding frame may be attached to the back surface of the protective film before or after or at the same time as attaching the first side of the substrate or the second side of the substrate to the front surface of the protective film. Preferably, the holding frame is attached to the back surface of the protective film before attaching the first or second side of the substrate to the front surface of the protective film. In this way, the handling of the protective film and the substrate can be further improved.

The holding frame may be made of a rigid material. For example, the holding frame may be made of a metal or a plastic.

The holding frame may have any type of shape. For example, the holding frame may be an annular frame. Alternatively, the holding frame may have, for example, a polygonal shape, such as a square or rectangular shape, with a central opening.

The central opening of the holding frame may have any type of shape. For example, the central opening of the holding frame may have a circular shape or a polygonal shape, such as a square or rectangular shape.

The holding frame may be a semiconductor-sized holding frame. Herein, the term "semiconductor-sized holding frame" refers to a holding frame with the dimensions (standardised dimensions), in particular, the inner diameter (standardised inner diameter), of a holding frame for holding a semiconductor wafer.

The dimensions, in particular, the inner diameters, of holding frames for holding semiconductor wafers are also defined in the SEMI standards. For example, the dimensions of tape frames for 300 mm wafers are defined in SEMI standard SEMI G74 and the dimensions of plastic tape frames for 300 mm wafers are defined in SEMI standard SEMI G87. The holding frames may have frame sizes for holding semiconductor-sized wafers with sizes of, for example, 3 inch, 4 inch, 5 inch, 6 inch, 8 inch, 12 inch or 18 inch.

The holding frame may have a thickness in the range of 1 mm to 5 mm or in the range of 1.2 mm to 4 mm or in the range of 1.5 mm to 3 mm or in the range of 1.8 mm to 2.5 mm.

The substrate may be, for example, made of a semiconductor, glass, sapphire ($Al_2O_3$), a ceramic, such as an alumina ceramic, quartz, zirconia, PZT (lead zirconate titanate), a polycarbonate, a metal (e.g., copper, iron, stainless steel, aluminium or the like) or metalised material, a ferrite, an optical crystal material, a resin or the like.

In particular, the substrate may be, for example, made of silicon carbide (SiC), silicon (Si), gallium arsenide (GaAs), gallium nitride (GaN), gallium phosphide (GaP), indium arsenide (InAs), indium phosphide (InP), silicon nitride (SiN), lithium tantalate (LT), lithium niobate (LN), aluminium nitride (AlN), silicon oxide ($SiO_2$) or the like.

The substrate may be a single crystal substrate, a glass substrate, a compound substrate, such as a compound semiconductor substrate, or a polycrystalline substrate, such as a ceramic substrate.

The substrate may be a wafer. For example, the substrate may be a semiconductor-sized wafer. Herein, the term "semiconductor-sized wafer" refers to a wafer with the dimensions (standardised dimensions), in particular, the diameter (standardised diameter), i.e., outer diameter, of a semiconductor wafer. The dimensions, in particular, the diameters, i.e., outer diameters, of semiconductor wafers are defined in the SEMI standards. For example, the dimensions of polished single crystal silicon (Si) wafers are defined in the SEMI standards M1 and M76. The semiconductor-sized wafer may be a 3 inch, 4 inch, 5 inch, 6 inch, 8 inch, 12 inch or 18 inch wafer.

The substrate may be a semiconductor wafer. For example, the substrate may be a silicon carbide (SiC) wafer, a silicon (Si) wafer, a gallium arsenide (GaAs) wafer, a gallium nitride (GaN) wafer, a gallium phosphide (GaP) wafer, an indium arsenide (InAs) wafer, an indium phosphide (InP) wafer, a silicon nitride (SiN) wafer, a lithium tantalate (LT) wafer, a lithium niobate (LN) wafer, an aluminium nitride (AlN) wafer, a silicon oxide ($SiO_2$) wafer or the like.

The substrate may have any type of shape. In a top view thereon, the substrate may have, for example, a circular shape, an oval shape, an elliptical shape or a polygonal shape, such as a rectangular shape or a square shape.

The substrate may have a device area with a plurality of devices. The device area may be formed on the first side of the substrate. The devices in the device area may be, for example, semiconductor devices, power devices, optical devices, medical devices, electrical components, MEMS devices or combinations thereof. The devices may comprise or be, for example, transistors, such as MOSFETs or insulated-gate bipolar transistors (IGBTs), or diodes, e.g., Schottky barrier diodes.

The substrate may further have, e.g., on the first side thereof, a peripheral marginal area having no devices and being formed around the device area.

The protective film may be made of a single material, in particular, a single homogeneous material.

The protective film may be made of a plastic material, such as a polymer. Particularly preferably, the protective film is made of a polyolefin. For example, the protective film may be made of polyethylene (PE), polypropylene (PP) or polybutylene (PB).

The protective film may have a thickness in the range of 5 to 500 μm, preferably 5 to 200 μm, more preferably 8 to 100 μm, even more preferably 10 to 80 μm and yet even more preferably 12 to 50 μm. Particularly preferably, the protective film has a thickness in the range of 80 to 150 μm.

The protective film may have any type of shape. In a top view thereon, the protective film may have, for example, a circular shape, an oval shape, an elliptical shape or a polygonal shape, such as a rectangular shape or a square shape.

Attaching the first side of the substrate or the second side of the substrate to the front surface of the protective film may comprise applying the protective film to the first side of the substrate or the second side of the substrate, so that at least a central area of the front surface of the protective film is in direct contact with the first side of the substrate or the second side of the substrate. In this case, no material, in particular, no adhesive, is present between at least the central area of the front surface of the protective film and the first side of the substrate or the second side of the substrate. The central area of the front surface of the protective film may correspond to a device area of the substrate.

By applying the protective film to the first or second side of the substrate so that at least a central area of the front surface of the protective film is in direct contact with the first or second side of the substrate, the risk of a possible contamination of or damage to the substrate, e.g., due to an adhesive force of an adhesive layer or adhesive residues on the substrate, can be significantly reduced or even eliminated.

The protective film may be applied to the first side of the substrate or the second side of the substrate so that, in the entire region where the front surface of the protective film is in contact with the first side of the substrate or the second side of the substrate, the front surface of the protective film is in direct contact with the first side of the substrate or the second side of the substrate. Thus, no material, in particular, no adhesive, is present between the front surface of the protective film and the first side of the substrate or the second side of the substrate.

In this way, the risk of a possible contamination of or damage to the substrate, e.g., due to an adhesive force of an adhesive layer or adhesive residues on the substrate, can be reliably eliminated.

The entire front surface of the protective film may be free of adhesive.

Attaching the first side of the substrate or the second side of the substrate to the front surface of the protective film may further comprise applying an external stimulus to the protective film during and/or after applying the protective film to the first side of the substrate or the second side of the substrate, so that the first side of the substrate or the second side of the substrate is attached to the front surface of the protective film.

By applying the external stimulus in this manner, an attachment force between protective film and substrate, holding the protective film in its position on the substrate, is generated. Hence, no additional adhesive material is necessary for attaching the protective film to the first side of the substrate or the second side of the substrate.

In particular, by applying the external stimulus to the protective film, a form fit, such as a positive fit, and/or a material bond, such as an adhesive bond, may be formed between the protective film and the substrate. The terms "material bond" and "adhesive bond" define an attachment or connection between protective film and substrate due to atomic and/or molecular forces acting between these two components.

The term "adhesive bond" relates to the presence of these atomic and/or molecular forces, which act so as to attach or adhere the protective film to the substrate, and does not imply the presence of an additional adhesive between protective film and substrate. Rather, in the embodiment detailed above, at least the central area of the front surface of the protective film is in direct contact with the first side of the substrate or the second side of the substrate.

Applying the external stimulus to the protective film may comprise or consist of heating the protective film and/or cooling the protective film and/or applying a vacuum to the protective film and/or irradiating the protective film with radiation, such as light, e.g., by using a laser beam.

The external stimulus may comprise or be a chemical compound and/or electron or plasma irradiation and/or a mechanical treatment, such as pressure, friction or ultrasound application, and/or static electricity.

Particularly preferably, applying the external stimulus to the protective film comprises or consists of heating the protective film. For example, applying the external stimulus to the protective film may comprise or consist of heating the protective film and applying a vacuum to the protective film. In this case, the vacuum may be applied to the protective film during and/or before and/or after heating the protective film.

If applying the external stimulus to the protective film comprises or consists of heating the protective film, the method may further comprise allowing the protective film to cool down after the heating process. In particular, the protective film may be allowed to cool down to its initial temperature, i.e., to the temperature thereof prior to the heating process. The protective film may be allowed to cool down, e.g., to its initial temperature, before processing the substrate from the side of the substrate which is opposite the side of the substrate attached to the front surface of the protective film and/or processing the substrate from the side of the substrate which is attached to the front surface of the protective film.

An attachment force between protective film and substrate is generated through the heating process. The attachment of the protective film to the substrate may be caused in the heating process itself and/or in a subsequent process of allowing the protective film to cool down.

The protective film may be softened by the heating process, e.g., so as to conform to the substrate surface to which the protective film is applied, for example, absorbing the substrate topography. Upon cooling down, e.g., to its initial temperature, the protective film may reharden, e.g., so as to create a form fit and/or a material bond to the substrate.

The protective film may be heat resistant up to a temperature of 180° C. or more, preferably up to a temperature of 220° C. or more, more preferably up to a temperature of 250° C. or more, and even more preferably up to a temperature of 300° C. or more.

The protective film may be heated to a temperature in the range of 30° C. to 250° C., preferably 50° C. to 200° C., more preferably 60° C. to 150° C. and even more preferably 70° C. to 110° C. Particularly preferably, the protective film is heated to a temperature of approximately 80° C.

The protective film may be heated over a duration in the range of 30 sec to 10 min, preferably 1 min to 8 min, more preferably 1 min to 6 min, even more preferably 1 min to 4 min and yet more preferably 1 min to 3 min, during and/or after applying the protective film to the first side of the substrate or the second side of the substrate.

If applying the external stimulus to the protective film comprises or consists of heating the protective film, the protective film may be directly and/or indirectly heated.

The protective film may be heated by directly applying heat thereto, e.g., using a heat application means, such as a heated roller, a heated stamp or the like, or a heat radiation means. The protective film and the substrate may be placed in a receptacle or chamber, such as a vacuum chamber, and an inner volume of the receptacle or chamber may be heated, so as to heat the protective film. The receptacle or chamber may be provided with a heat radiation means.

The protective film may be indirectly heated, e.g., by heating the substrate before and/or during and/or after applying the protective film to the first side of the substrate or the second side of the substrate. For example, the substrate may be heated by placing the wafer on a support member or carrier, such as a chuck table, and heating the support member or carrier.

For example, the support member or carrier, such as a chuck table, may be heated to a temperature in the range of 30° C. to 250° C., preferably 50° C. to 200° C., more preferably 60° C. to 150° C. and even more preferably 70°

C. to 110° C. Particularly preferably, the support member or carrier may be heated to a temperature of approximately 80° C.

These approaches may also be combined, for example, by using a heat application means, such as a heated roller or the like, or a heat radiation means for directly heating the protective film, and also indirectly heating the protective film through the substrate.

If applying the external stimulus to the protective film comprises or consists of heating the protective film, it is preferable that the protective film is pliable, elastic, flexible, stretchable, soft and/or compressible when in its heated state. In this way, it can be particularly reliably ensured that the protective film conforms to the substrate surface on the side of the substrate to which the protective film is applied, for example, absorbing the substrate topography. This is especially advantageous if protrusions, such as surface unevenness or roughness, bumps, optical elements or the like, protruding along a thickness direction of the substrate are present on this substrate surface.

Preferably, the protective film, at least to some degree, hardens or stiffens upon cooling down, so as to become more rigid and/or robust in the cooled down state. In this way, particularly reliable protection of the substrate during subsequent processing thereof, such as cutting, grinding and/or polishing, can be ensured.

The method may further comprise, during and/or after applying the protective film to the first or second side of the substrate, applying pressure to the back surface of the protective film. In this way, the front surface of the protective film is pressed against the first or second side of the substrate. Thus, it can be particularly efficiently ensured that the protective film is reliably attached to the substrate.

If applying the external stimulus to the protective film comprises heating the protective film, the pressure may be applied to the back surface of the protective film before and/or during and/or after heating the protective film. The pressure may be applied to the back surface of the protective film before processing the substrate.

The pressure may be applied to the back surface of the protective film by a pressure application means, such as a roller, a stamp, a membrane or the like.

Particularly preferably, a combined heat and pressure application means, such as a heated roller or a heated stamp, may be used. In this case, pressure can be applied to the back surface of the protective film while, at the same time, heating the protective film.

The pressure may be applied to the back surface of the protective film in a vacuum chamber.

The protective film may be applied and/or attached to the first or second side of the substrate in a reduced pressure atmosphere, in particular, under a vacuum. In this way, it can be reliably ensured that no voids and/or air bubbles are present between the protective film and the substrate. Hence, any stress or strain on the substrate during processing thereof, e.g., due to such air bubbles expanding in the heating process, is avoided.

If applying the external stimulus to the protective film comprises or consists of heating the protective film, it is particularly preferable to use a protective film made of a polyolefin. For example, the protective film may be made of polyethylene (PE), polypropylene (PP) or polybutylene (PB).

Polyolefin films have material properties which are especially advantageous for use in the substrate processing methods of the present invention, in particular, if applying the external stimulus to the protective film comprises or consists of heating the protective film. Polyolefin films are pliable, stretchable and soft when in a heated state, e.g., when heated to a temperature in the range of 60° C. to 150° C. Thus, it can be particularly reliably ensured that the protective film conforms to the substrate surface to which the protective film is applied, for example, absorbing the substrate topography. This is particularly beneficial if this substrate surface is formed with protrusions or projections protruding from the plane surface of the substrate.

Further, polyolefin films harden and stiffen upon cooling down, so as to become more rigid and robust in the cooled down state. Hence, particularly reliable protection of the substrate during subsequent processing thereof, such as cutting, grinding and/or polishing the substrate, can be ensured.

Attaching the holding frame to the back surface of the protective film may comprise applying the protective film to the holding frame, so that the back surface of the protective film is in direct contact with the holding frame. In this case, no material, in particular, no adhesive, is present between the back surface of the protective film and the holding frame.

In this way, the risk of a possible contamination of or damage to the holding frame, e.g., due to an adhesive force of an adhesive layer or adhesive residues on the holding frame, can be reliably eliminated.

The entire back surface of the protective film may be free of adhesive.

Attaching the holding frame to the back surface of the protective film may further comprise applying an external stimulus to the protective film during and/or after applying the protective film to the holding frame, so that the holding frame is attached to the back surface of the protective film.

By applying the external stimulus in this manner, an attachment force between protective film and holding frame, holding the protective film in its position on the holding frame, is generated. Hence, no additional adhesive material is necessary for attaching the protective film to the holding frame.

In particular, by applying the external stimulus to the protective film, a form fit, such as a positive fit, and/or a material bond, such as an adhesive bond, may be formed between the protective film and the holding frame. The terms "material bond" and "adhesive bond" define an attachment or connection between protective film and holding frame due to atomic and/or molecular forces acting between these two components.

The external stimulus may be as detailed above. The external stimulus may be applied to the protective film at least substantially in the same manner as described above.

Alternatively, the holding frame may be attached to the back surface of the protective film by means of an adhesive. For example, the adhesive may be applied to the holding frame and/or to the back surface of the protective film by a heat seal or a heat stamp. The adhesive may be applied to the holding frame and/or to the back surface of the protective film before attaching the holding frame to the protective film. Preferably, the adhesive may be applied only to a portion of the back surface of the protective film, in particular, to a peripheral area of the back surface of the protective film.

A cushioning layer may be attached to the back surface of the protective film opposite to the front surface thereof.

This approach is particularly advantageous, if protrusions, projections, recesses and/or trenches, such as surface unevenness or roughness, bumps, optical elements, e.g., optical lenses, other structures or the like, protrude, extend or project along the thickness direction of the substrate from the side of the substrate to which the protective film is applied. In this case, the protrusions or projections define a surface structure or topography of the respective substrate side, rendering this side uneven.

If the cushioning layer is attached to the back surface of the protective film, such protrusions and/or recesses can be embedded in the cushioning layer. Hence, any negative influence of the surface unevenness arising from the presence of the protrusions on subsequent substrate processing steps, such as cutting, grinding and/or polishing, can be eliminated. In particular, the cushioning layer can significantly contribute to achieving a particularly uniform and homogeneous distribution of pressure during a cutting, grinding and/or polishing process.

By embedding the protrusions in the cushioning layer, the protrusions, such as for example optical elements or other structures, are reliably protected from any damage during substrate processing, for example, in a subsequent cutting, grinding and/or polishing step.

The material of the cushioning layer is not particularly limited. In particular, the cushioning layer may be formed of any type of material which allows for protrusions protruding along the thickness direction of the substrate to be embedded therein. For example, the cushioning layer may be formed of a resin, an adhesive, a gel or the like.

The cushioning layer may be curable by an external stimulus, such as UV radiation, heat, an electric field and/or a chemical agent. In this case, the cushioning layer hardens at least to some degree upon application of the external stimulus thereto. For example, the cushioning layer may be formed of a curable resin, a curable adhesive, a curable gel or the like.

The cushioning layer may be configured so as to exhibit a degree of compressibility, elasticity and/or flexibility after curing thereof, i.e., to be compressible, elastic and/or flexible after curing. For example, the cushioning layer may be such that it is brought into a rubber-like state by curing. Alternatively, the cushioning layer may be configured so as to reach a rigid, hard state after curing.

Preferred examples of UV curable resins for use as the cushioning layer in the methods of the invention are ResiFlat by the DISCO Corporation and TEMPLOC by DENKA.

The method may further comprise applying the external stimulus to the cushioning layer so as to cure the cushioning layer, before processing, e.g., cutting, grinding and/or polishing, the substrate. In this way, the protection of the substrate during processing and the processing accuracy can be further improved.

The cushioning layer may be heat resistant up to a temperature of 180° C. or more, preferably up to a temperature of 220° C. or more, more preferably up to a temperature of 250° C. or more, and even more preferably up to a temperature of 300° C. or more.

The cushioning layer may have a thickness in the range of 10 to 300 μm, preferably 20 to 250 μm and more preferably 50 to 200 μm.

The cushioning layer may be attached to the back surface of the protective film before applying the protective film to the first or second side of the substrate.

In this case, the protective film and the cushioning layer may be laminated first, forming a protective sheeting comprising the cushioning layer and the protective film attached to the cushioning layer. The protective sheeting formed in this manner may be subsequently applied to the first or second side of the substrate, e.g., such that protrusions or projections protruding from the plane surface of the substrate are covered by the protective film and embedded in the protective film and the cushioning layer. The protective sheeting may be applied so that the back surface of the cushioning layer is substantially parallel to the side of the substrate which is opposite the side of the substrate applied to the front surface of the protective film. Thus, when processing, e.g., cutting, grinding and/or polishing, the substrate, a suitable counter pressure can be applied to the back surface of the cushioning layer, e.g., by placing this back surface on a chuck table.

The front surface of the protective film is applied to the first or second side of the substrate when the protective sheeting is applied to the first or second side of the substrate.

In this way, the substrate processing method can be carried out in a particularly simple and efficient manner. For example, the protective sheeting can be prepared in advance, stored for later use and used for substrate processing when required. The protective sheeting may thus be manufactured in large quantities, rendering the production thereof particularly efficient in terms of both time and cost.

The cushioning layer may be attached to the back surface of the protective film after applying the protective film to the first or second side of the substrate.

In this case, the protective film is applied to the first or second side of the substrate first, and the first or second side of the substrate, having the protective film applied thereto, is subsequently attached to the front surface of the cushioning layer, e.g., so that protrusions or projections protruding from the plane surface of the substrate are embedded in the protective film and the cushioning layer, and the back surface of the cushioning layer is substantially parallel to the side of the substrate which is opposite the side of the substrate applied to the front surface of the protective film. This approach allows for the protective film to be attached to the first or second side of the substrate with a particularly high degree of accuracy, in particular, in relation to protrusions or projections protruding from the plane surface of the substrate.

The cushioning layer may be attached to the back surface of the protective film before and/or during and/or after attaching the protective film to the first or second side of the substrate.

The method may further comprise removing the protective film and the cushioning layer from the substrate. The protective film and the cushioning layer may be removed from the substrate after processing the substrate.

The cushioning layer and the protective film may be removed individually, i.e., one after the other. For example, the cushioning layer may be removed first, followed by the removal of the protective film. Alternatively, the cushioning layer and the protective film may be removed together.

Preferably, if a cushioning layer is present, the holding frame is directly attached to the back surface of the protective film. In this case, the cushioning layer is not present between the holding frame and the back surface of the protective film in the area where the holding frame is attached to the back surface of the protective film. For example, the cushioning layer may have a lateral extension, e.g., a diameter, which is smaller than a lateral extension, e.g., a diameter, of the protective film. The lateral extension, e.g., the diameter, of the cushioning layer may be substantially the same as or larger, e.g., slightly larger, than a lateral extension, e.g., a diameter, of the substrate. The cushioning layer may not be present in a peripheral portion of the protective film. The cushioning layer may only be present in a central portion of the protective film. The peripheral portion of the protective film may be arranged around, i.e., so as to surround, the central portion of the protective film.

The substrate may be attached to the front surface of the protective film in the central portion of the protective film.

Alternatively, if a cushioning layer is present, the holding frame may be attached to the back surface of the protective film by attaching the holding frame to the back surface of the cushioning layer.

The protective film and the cushioning layer together form a protective sheeting. The front surface of the protective sheeting may be formed by the front surface of the protective film. The back surface of the protective sheeting may be formed by the back surface of the cushioning layer or, preferably, by the back surface of the protective film and the back surface of the cushioning layer. The back surface of the protective sheeting may be formed by the back surface of the cushioning layer in a central portion of the protective sheeting. The back surface of the protective sheeting may be formed by the back surface of the protective film in a peripheral portion of the protective sheeting. The peripheral portion of the protective sheeting may be arranged around, i.e., so as to surround, the central portion of the protective sheeting. The central portion of the protective sheeting may correspond to the central portion of the protective film. The peripheral portion of the protective sheeting may correspond to the peripheral portion of the protective film. The holding frame may be attached to the back surface of the protective sheeting.

Attaching the holding frame to the back surface of the protective sheeting, i.e., preferably, directly to the back surface of the protective film or, alternatively, to the back surface of the cushioning layer, may comprise applying the protective sheeting to the holding frame, so that the back surface of the protective sheeting is in direct contact with the holding frame. In this case, no material, in particular, no adhesive, is present between the back surface of the protective sheeting and the holding frame.

The entire back surface of the protective sheeting may be free of adhesive.

Attaching the holding frame to the back surface of the protective sheeting may further comprise applying an external stimulus to the protective sheeting during and/or after applying the protective sheeting to the holding frame, so that the holding frame is attached to the back surface of the protective sheeting.

By applying the external stimulus in this manner, an attachment force between protective sheeting and holding frame, holding the protective sheeting in its position on the holding frame, is generated. Hence, no additional adhesive material is necessary for attaching the protective sheeting to the holding frame.

The external stimulus may be as detailed above. The external stimulus may be applied to the protective sheeting at least substantially in the same manner as described above.

A base sheet may be attached to the back surface of the cushioning layer opposite to the front surface thereof which is attached to the protective film.

The material of the base sheet is not particularly limited. The base sheet may be made of a soft or pliable material, such as, for example, a polymer material, e.g., polyvinyl chloride (PVC), ethylene vinyl acetate (EVA) or a polyolefin.

Alternatively, the base sheet may be made of a rigid or hard material, such as polyethylene terephthalate (PET) and/or silicon and/or glass and/or stainless steel (SUS).

For example, if the base sheet is made of polyethylene terephthalate (PET) or glass and the cushioning layer is curable by an external stimulus, the cushioning layer may be cured with radiation that is transmittable through polyethylene terephthalate (PET) or glass, for instance UV radiation. If the base sheet is made of silicon or stainless steel (SUS), a cost-efficient base sheet is provided.

Also, the base sheet may be formed of a combination of the materials listed above.

The base sheet may be heat resistant up to a temperature of 180° C. or more, preferably up to a temperature of 220° C. or more, more preferably up to a temperature of 250° C. or more, and even more preferably up to a temperature of 300° C. or more.

The base sheet may have a thickness in the range of 30 to 1500 µm, preferably 40 to 1200 µm and more preferably 50 to 1000 µm.

The cushioning layer and the base sheet may be attached to the back surface of the protective film before or after applying the protective film to the first or second side of the substrate. In particular, the protective film, the cushioning layer and the base sheet may be laminated first, forming a protective sheeting comprising the base sheet, the cushioning layer and the protective film attached to the cushioning layer. The protective sheeting formed in this manner may be subsequently applied to the substrate.

The front surface of the base sheet may be in contact with the back surface of the cushioning layer, and a back surface of the base sheet opposite to the front surface thereof may be substantially parallel to the side of the substrate which is opposite the side of the substrate applied to the front surface of the protective film. Thus, when processing, e.g., cutting, grinding and/or polishing, the substrate, a suitable counter pressure can be applied to the back surface of the base sheet, e.g., by placing this back surface on a chuck table.

The method may further comprise removing the protective film, the cushioning layer and the base sheet from the substrate. The protective film, the cushioning layer and the base sheet may be removed from the substrate after processing the substrate.

The base sheet, the cushioning layer and the protective film may be removed individually, i.e., one after the other. For example, the base sheet may be removed first, followed by the removal of the cushioning layer and, subsequently, the removal of the protective film. Alternatively, the base sheet, the cushioning layer and the protective film may be removed together.

Preferably, if a cushioning layer and a base sheet are present, the holding frame is directly attached to the back surface of the protective film. In this case, the cushioning layer and the base sheet are not present between the holding frame and the back surface of the protective film in the area where the holding frame is attached to the back surface of the protective film. For example, the cushioning layer and the base sheet may have lateral extensions, e.g., diameters, which are smaller than a lateral extension, e.g., a diameter, of the protective film. The lateral extension, e.g., the diameter, of the cushioning layer may be substantially the same as or larger, e.g., slightly larger, than a lateral extension, e.g., a diameter, of the substrate. The lateral extension, e.g., the diameter, of the base sheet may be substantially the same as or larger, e.g., slightly larger, than the lateral extension, e.g., the diameter, of the substrate. The lateral extension, e.g., the diameter, of the cushioning layer may be substantially the same as the lateral extension, e.g., the diameter, of the base sheet. The cushioning layer and the base sheet may not be present in a peripheral portion of the protective film. The cushioning layer and the base sheet may only be present in a central portion of the protective film. The peripheral portion of the protective film may be arranged around, i.e., so as to surround, the central portion of the protective film.

The substrate may be attached to the front surface of the protective film in the central portion of the protective film.

Alternatively, if a cushioning layer and a base sheet are present, the holding frame may be attached to the back surface of the protective film by attaching the holding frame to the back surface of the base sheet.

The protective film, the cushioning layer and the base sheet together form a protective sheeting. The front surface of the protective sheeting may be formed by the front surface of the protective film. The back surface of the protective sheeting may be formed by the back surface of the base sheet or, preferably, by the back surface of the protective film and the back surface of the base sheet. The back surface of the protective sheeting may be formed by the back surface of the base sheet in a central portion of the protective sheeting. The back surface of the protective sheeting may be formed by the back surface of the protective film in a peripheral portion of the protective sheeting. The peripheral portion of the protective sheeting may be arranged around, i.e., so as to surround, the central portion of the protective sheeting. The central portion of the protective sheeting may correspond to the central portion of the protective film. The peripheral portion of the protective sheeting may correspond to the peripheral portion of the protective film. The holding frame may be attached to the back surface of the protective sheeting.

Attaching the holding frame to the back surface of the protective sheeting, i.e., preferably, directly to the back surface of the protective film or, alternatively, to the back surface of the base sheet, may comprise applying the protective sheeting to the holding frame, so that the back surface of the protective sheeting is in direct contact with the holding frame. In this case, no material, in particular, no adhesive, is present between the back surface of the protective sheeting and the holding frame.

The entire back surface of the protective sheeting may be free of adhesive.

Attaching the holding frame to the back surface of the protective sheeting may further comprise applying an external stimulus to the protective sheeting during and/or after applying the protective sheeting to the holding frame, so that the holding frame is attached to the back surface of the protective sheeting.

By applying the external stimulus in this manner, an attachment force between protective sheeting and holding frame, holding the protective sheeting in its position on the holding frame, is generated. Hence, no additional adhesive material is necessary for attaching the protective sheeting to the holding frame.

The external stimulus may be as detailed above. The external stimulus may be applied to the protective sheeting at least substantially in the same manner as described above.

At least one division line may be formed on the first side of the substrate. A plurality of division lines may be formed on the first side of the substrate. The plurality of division lines may be provided in a lattice arrangement on the first side of the substrate, i.e., arranged so as to cross or intersect each other, e.g., at angles of substantially 90°. The one or more division lines may partition the devices formed in the device area.

The width of the at least one division line may be in the range of 20 μm to 200 μm, preferably 30 μm to 150 μm and more preferably 30 μm to 100 μm.

The first side of the substrate may be attached to the front surface of the protective film. Alternatively, the second side of the substrate may be attached to the front surface of the protective film.

The method of the invention may further comprise providing a support member having a support surface. Moreover, the method may comprise placing the substrate attached to the front surface of the protective film on the support surface of the support member, so that the back surface of the protective film is in contact with the support surface. In this case, the side of the substrate which is opposite the side of the substrate attached to the front surface of the protective film is exposed, e.g., facing upward, so that the substrate can be processed from this side in a particularly simple and efficient manner.

Alternatively, the substrate attached to the front surface of the protective film may be placed on the support surface of the support member, so that the side of the substrate which is opposite the side of the substrate attached to the front surface of the protective film is in contact with the support surface. In this case, the substrate can be processed from the side of the substrate attached to the front surface of the protective film in a particularly simple and efficient manner.

The substrate may be placed on the support surface of the support member prior to processing the substrate. The substrate may be processed while it is placed on the support surface of the support member.

An outer diameter of the support member in the plane of the support surface may be smaller than a diameter of the central opening of the holding frame, i.e., smaller than an inner diameter of the holding frame. Herein, the expression "outer diameter of the support member in the plane of the support surface" defines the outer diameter of the support member in the radial directions of the support member.

The support member may be in the form of a support table, e.g., having a circular cross-section in the plane of the support surface. For example, the support member may be a chuck table. The support member may have a continuous support surface.

When the substrate attached to the protective film is placed on the support surface of the support member, at least a portion of the substrate attached to the protective film may rest on the support surface, e.g., with the protective film being arranged between substrate and support surface. The entire substrate attached to the protective film may rest on the support surface, e.g., with the protective film being arranged between substrate and support surface.

The support member may be provided with a holding means for holding the substrate on the support surface. The holding means may be a suction means for holding the substrate on the support surface under suction.

The method of the invention may further comprise providing a supporting means for supporting the holding frame. The supporting means may be arranged, for example, around the circumference of the support member. The supporting means may be configured to support the holding frame so as to hold it in its position relative to the support member.

The method may comprise placing the holding frame on the supporting means so that at least a portion of the holding frame rests on the supporting means. The entire holding frame may rest on the supporting means.

The holding frame may be placed on the supporting means prior to processing the substrate. The substrate may be processed while the holding frame is placed on the supporting means.

The method of the invention may further comprise providing an inspection device. The inspection device may be configured to inspect and/or detect alignment marks formed on a surface of the substrate. In particular, the inspection device may be configured to inspect and/or detect one or more division lines formed on a surface of the substrate. For example, the inspection device may comprise or be a camera, a detector or the like.

The method may comprise inspecting the side of the substrate which is attached to the front surface of the protective film by means of the inspection device through the protective film. This inspection process may comprise or consist of inspecting and/or detecting alignment marks formed on this side of the substrate. In particular, the inspection process may comprise or consist of inspecting and/or detecting one or more division lines formed on this side of the substrate.

The side of the substrate which is attached to the front surface of the protective film may be inspected by means of the inspection device through the protective film prior to processing the substrate.

By inspecting and/or detecting alignment marks, e.g., one or more division lines, formed on the substrate side in the above-identified manner, precise and efficient alignment of the substrate for subsequent processing thereof can be achieved.

For example, one or more division lines may be formed on the first side of the substrate. The first side of the substrate may be attached to the front surface of the protective film. Inspecting and/or detecting the one or more division lines by means of the inspection device through the protective film allows for particularly precise and efficient inspection and/or detection of the division line or lines so that the substrate can be accurately aligned. This applies, in particular, to substrates for which the inspection and/or detection of alignment marks formed on the first substrate side from the second substrate side, e.g., by means of an infrared (IR) camera, is difficult or even impossible, such as substrates with a metal layer on the second side, highly-doped wafers, thick substrates, bonded substrates and substrates with a high degree of surface roughness on the second side.

If the method comprises inspecting the side of the substrate which is attached to the front surface of the protective film by means of the inspection device through the protective film, it is particularly preferable to attach the substrate to the front surface of the protective film so that at least a central area of the front surface of the protective film is in direct contact with the substrate. In this case, no material, in particular, no adhesive, is present between at least the central area of the front surface of the protective film and the substrate. Hence, due to the absence of such material, in particular, an adhesive, alignment marks formed on the substrate can be inspected and/or detected through the protective film with a particularly high degree of precision.

The method may comprise inspecting the side of the substrate which is attached to the front surface of the protective film by means of the inspection device through the support member. The support member may be at least partly transparent for radiation, such as visible light, used by the inspection device. For example, the support member may be at least partly or entirely made of a transparent material or comprise an opening or window through which the inspection device can inspect the substrate. The inspection device may be arranged on or at the support member or, at least partly, within or inside the support member.

The protective film may be provided with an adhesive layer. The adhesive layer may be provided only in a peripheral area of the front surface of the protective film. The peripheral area of the front surface of the protective film may be arranged so as to surround the central area of the front surface of the protective film.

The first side of the substrate or the second side of the substrate may be attached to the front surface of the protective film so that the adhesive layer comes into contact only with a peripheral portion of the first side of the substrate or the second side of the substrate. The peripheral portion of the first or second side of the substrate may be or correspond to a peripheral marginal area of the substrate.

By using such an adhesive layer, the attachment of the protective film to the substrate can be further improved. Moreover, since the adhesive layer is provided only in the peripheral area of the front surface of the protective film, the area in which protective film and substrate are attached to each other by the adhesive layer is significantly reduced as compared to a case where an adhesive layer is provided on the entire front surface of the protective film. Thus, the protective film can be detached from the substrate more easily and the risk of damage to the substrate, in particular, to devices formed thereon, is considerably reduced.

The adhesive of the adhesive layer may be curable by an external stimulus, such as heat, UV radiation, an electric field and/or a chemical agent. In this way, the protective film can be particularly easily removed from the substrate after processing. The external stimulus may be applied to the adhesive so as to lower the adhesive force thereof, thus allowing for an easy removal of the protective film.

For example, the adhesive layer may have a substantially annular shape, an open rectangular shape or an open square shape, i.e., a rectangular or square shape, respectively, with an opening in the centre of the adhesive layer.

The protective film may be expandable. The protective film may be expanded when being applied to the first or second side of the substrate. If protrusions and/or recesses are present on the respective side of the substrate, the protective film may be expanded when being applied to the side of the substrate so as to closely or at least partly follow the contours of these protrusions.

In particular, the protective film may be expandable to twice its original size or more, preferably three times its original size or more and more preferably four times its original size or more. In this way, in particular, for the case of an expansion to three or four times its original size or more, it can be reliably ensured that the protective film follows the contours of the protrusions.

If the protective film is expandable, it may be used for separating devices formed on the substrate from each other, as will be further detailed below. In particular, the method may further comprise, after processing the substrate, radially expanding the protective film so as to separate the devices from each other.

For example, the substrate may be fully divided, e.g., by a mechanical cutting process, a laser cutting process and/or a plasma cutting process, or by a dicing before grinding process. Subsequently, the fully divided devices, which may be in the form of chips or dies, may be moved away from each other by radially expanding the protective film, thereby increasing the distances between adjacent devices.

The substrate may be processed from the side of the substrate which is opposite the side of the substrate attached to the front surface of the protective film.

Processing the substrate from the side of the substrate which is opposite the side of the substrate attached to the front surface of the protective film may comprise cutting and/or grinding and/or polishing the substrate from the side of the substrate which is opposite the side of the substrate attached to the front surface of the protective film.

In particular, the substrate may be cut from the side of the substrate which is opposite the side of the substrate attached to the front surface of the protective film along one or more division lines, e.g., one or more division lines formed on the side of the substrate attached to the front surface of the protective film.

In the cutting process, substrate material may be removed along the at least one division line throughout the entire thickness of the substrate. In this case, the substrate is divided along the at least one division line into a plurality of chips or dies by the substrate material removal process.

Alternatively, the substrate material may be removed along the at least one division line along only part of the thickness of the substrate. For example, the substrate material may be removed along 20% or more, 30% or more, 40% or more, 50% or more, 60% or more, 70% or more, 80% or more, or 90% or more of the thickness of the substrate.

In this case, a process of dividing, i.e., fully dividing, the substrate may be carried out, for example, by adopting a breaking process, applying an external force to the substrate, e.g., using an expansion tape, or by adopting a further cutting or dicing process, such as a mechanical cutting or dicing process, a laser cutting or dicing process or a plasma cutting or dicing process. For example, an external force may be applied to the substrate by radially expanding the protective film, i.e., by using the protective film as an expansion tape. Further, also a combination of two or more of these processes may be employed.

The substrate material may be mechanically removed along the at least one division line. In particular, the substrate material may be removed along the at least one division line by mechanically cutting the substrate along the at least one division line, e.g., by blade dicing or sawing.

Alternatively or in addition, the substrate material may be removed along the at least one division line by laser cutting and/or by plasma cutting.

The substrate may be cut in a single mechanical cutting step, a single laser cutting step or a single plasma cutting step. Alternatively, the substrate may be cut by a sequence of mechanical cutting and/or laser cutting and/or plasma cutting steps.

Laser cutting may be performed, for example, by ablation laser cutting and/or by stealth laser cutting, i.e., by forming modified regions within the substrate by the application of a laser beam, as will be further detailed below, and/or by forming a plurality of hole regions in the substrate by the application of a laser beam. Each of these hole regions may be composed of a modified region and a space in the modified region open to a surface of the substrate.

By having the protective film attached to substrate, it can be ensured that the pressure applied during the cutting step is more uniformly and homogeneously distributed throughout the substrate during cutting, thus reducing or even minimising any risk of damage to the substrate, e.g., cracking of the sidewalls of the resulting chips or dies, in the cutting step.

In a stealth laser cutting process, a laser beam having a wavelength that allows transmission of the laser beam through the substrate is applied to the substrate. Thus, the substrate is made of a material which is transparent to the laser beam. The laser beam is applied to the substrate at least in a plurality of positions along the at least one division line so as to form a plurality of modified regions in the substrate, e.g., inside or within the bulk of the substrate, along the at least one division line.

The laser beam may be a pulsed laser beam. The pulsed laser beam may have a pulse width, for example, in the range of 1 fs to 1000 ns.

The modified regions are regions of the substrate which have been modified by the application of the laser beam. The modified regions may be regions of the substrate in which the structure of the substrate material has been modified. The modified regions may be regions of the substrate in which the substrate has been damaged.

By forming these modified regions, the strength of the substrate in the areas thereof where the modified regions are formed is reduced. Hence, division of the substrate along the at least one division line where the plurality of modified regions has been formed is greatly facilitated. In such a substrate division process, individual devices provided in a device area of the substrate are obtained as chips or dies.

The modified regions may comprise amorphous regions or regions in which cracks are formed or may be amorphous regions or regions in which cracks are formed. In particularly preferred embodiments, the modified regions comprise or are amorphous regions.

Each modified region may comprise a space, e.g., a cavity, inside the substrate material, the space being surrounded by an amorphous region or a region in which cracks are formed.

Each modified region may be composed of a space, e.g., a cavity, inside the substrate material and an amorphous region or a region in which cracks are formed surrounding the space.

If the modified regions comprise or are regions in which cracks are formed, i.e., cracks have been formed, the cracks may be microcracks. The cracks may have dimensions, e.g., lengths and/or widths, in the μm range. For example, the cracks may have widths in the range of 5 μm to 100 μm and/or lengths in the range of 100 μm to 1000 μm.

The method may further comprise, after forming the plurality of modified regions in the substrate, dividing the substrate along the at least one division line. The process of dividing the substrate may be carried out in various ways, e.g., by adopting a breaking process, applying an external force to the substrate, for example, using an expansion tape, or by adopting a cutting or dicing process, such as a mechanical cutting or dicing process, a laser cutting or dicing process or a plasma cutting or dicing process. For example, an external force may be applied to the substrate by radially expanding the protective film, i.e., by using the protective film as an expansion tape. Further, also a combination of two or more of these processes may be employed.

Processing the substrate from the side of the substrate which is opposite the side of the substrate attached to the front surface of the protective film may further comprise grinding the substrate from the side of the substrate which is opposite the side of the substrate attached to the front surface of the protective film, so as to adjust the substrate thickness. Such a grinding process may be performed before and/or after cutting the substrate.

For example, the method of the invention may comprise a dicing before grinding process. In particular, before attaching the first or second side of the substrate to the front surface of the protective film, the substrate may be partially cut, i.e., cut along only part of its thickness, from the substrate side to be attached to the protective film. Subsequently, this substrate side may be attached to the protective film and the opposite substrate side may be ground along a remaining part of the thickness of the substrate in which no substrate material has been removed in the partial cutting process, so as to divide the substrate, e.g., along the at least one division line.

Processing the substrate from the side of the substrate which is opposite the side of the substrate attached to the front surface of the protective film may further comprise polishing the substrate from the side of the substrate which is opposite the side of the substrate attached to the front surface of the protective film. If the substrate is also subjected to a grinding process, the substrate is preferably polished after grinding.

The process of polishing the substrate from the side of the substrate which is opposite the side of the substrate attached to the front surface of the protective film may comprise or consist of chemical mechanical polishing (CMP), dry polishing (DP) and/or other types of polishing processes.

Processing the substrate from the side of the substrate which is opposite the side of the substrate attached to the front surface of the protective film may further comprise etching, e.g., plasma etching, the substrate from the side of the substrate which is opposite the side of the substrate attached to the front surface of the protective film.

The substrate may be processed from the side of the substrate which is attached to the front surface of the protective film.

Processing the substrate from the side of the substrate which is attached to the front surface of the protective film may comprise irradiating the substrate with radiation, such as light, e.g., by using a laser beam, from the side of the substrate attached to the front surface of the protective film. The substrate may be irradiated with light, e.g., by using a laser beam, through the protective film.

In particular, the substrate may be subjected to a stealth laser cutting process through the protective film. In such a process, a laser beam having a wavelength that allows transmission of the laser beam through the protective film and through the substrate is applied to the substrate so as to form a plurality of modified regions in the substrate, as has been detailed above.

The invention also provides a further method of processing a substrate having a first side and a second side opposite the first side. The method comprises providing a protective sheeting having a front surface and a back surface opposite the front surface and providing a holding frame for holding the substrate. The holding frame has a central opening. The method further comprises attaching the holding frame to the front surface or the back surface of the protective sheeting so as to close the central opening of the holding frame by the protective sheeting and attaching the first side of the substrate or the second side of the substrate to the front surface of the protective sheeting. Moreover, the method comprises processing the substrate from the side of the substrate which is opposite the side of the substrate attached to the front surface of the protective sheeting and/or processing the substrate from the side of the substrate which is attached to the front surface of the protective sheeting. Attaching the holding frame to the front surface or the back surface of the protective sheeting comprises applying the protective sheeting to the holding frame, so that the front surface or the back surface of the protective sheeting is in direct contact with the holding frame, and applying an external stimulus to the protective sheeting during and/or after applying the protective sheeting to the holding frame, so that the holding frame is attached to the front surface or the back surface of the protective sheeting.

All the features and explanations provided above for the first method of the invention also apply to this second method of the invention.

The substrate and the holding frame may have the properties, characteristics and features described in detail above.

The protective sheeting may comprise the protective film described in detail above. The front surface of the protective sheeting may be formed by the front surface of the protective film.

The protective sheeting may consist of the protective film described in detail above. In this case, the front surface of the protective sheeting is the front surface of the protective film and the back surface of the protective sheeting is the back surface of the protective film.

The protective sheeting may comprise the protective film and the cushioning layer described in detail above.

The protective sheeting may consist of the protective film and the cushioning layer described in detail above.

The front surface of the protective sheeting may be formed by the front surface of the protective film. The back surface of the protective sheeting may be formed by the back surface of the cushioning layer or, preferably, by the back surface of the protective film and the back surface of the cushioning layer. The back surface of the protective sheeting may be formed by the back surface of the cushioning layer in a central portion of the protective sheeting. The back surface of the protective sheeting may be formed by the back surface of the protective film in a peripheral portion of the protective sheeting. The peripheral portion of the protective sheeting may be arranged around, i.e., so as to surround, the central portion of the protective sheeting. The holding frame may be attached to the protective sheeting in the peripheral portion of the protective sheeting.

For example, the cushioning layer may have a lateral extension, e.g., a diameter, which is smaller than a lateral extension, e.g., a diameter, of the protective film. The lateral extension, e.g., the diameter, of the cushioning layer may be substantially the same as or larger, e.g., slightly larger, than a lateral extension, e.g., a diameter, of the substrate. The cushioning layer may not be present in a peripheral portion of the protective film. The cushioning layer may only be present in a central portion of the protective film. The peripheral portion of the protective film may be arranged around, i.e., so as to surround, the central portion of the protective film. The substrate may be attached to the front surface of the protective sheeting in the central portion of the protective film.

The protective sheeting may comprise the protective film, the cushioning layer and the base sheet described in detail above.

The protective sheeting may consist of the protective film, the cushioning layer and the base sheet described in detail above.

The front surface of the protective sheeting may be formed by the front surface of the protective film. The back surface of the protective sheeting may be formed by the back surface of the base sheet or, preferably, by the back surface of the protective film and the back surface of the base sheet. The back surface of the protective sheeting may be formed by the back surface of the base sheet in a central portion of the protective sheeting. The back surface of the protective sheeting may be formed by the back surface of the protective film in a peripheral portion of the protective sheeting. The peripheral portion of the protective sheeting may be arranged around, i.e., so as to surround, the central portion of the protective sheeting. The holding frame may be attached to the protective sheeting in the peripheral portion of the protective sheeting.

For example, the cushioning layer and the base sheet may have lateral extensions, e.g., diameters, which are smaller than a lateral extension, e.g., a diameter, of the protective film. The lateral extension, e.g., the diameter, of the cushioning layer may be substantially the same as or larger, e.g., slightly larger, than a lateral extension, e.g., a diameter, of the substrate. The lateral extension, e.g., the diameter, of the base sheet may be substantially the same as or larger, e.g., slightly larger, than the lateral extension, e.g., the diameter, of the substrate. The lateral extension, e.g., the diameter, of the cushioning layer may be substantially the same as the lateral extension, e.g., the diameter, of the base sheet. The cushioning layer and the base sheet may not be present in a peripheral portion of the protective film. The cushioning layer and the base sheet may only be present in a central portion of the protective film. The peripheral portion of the protective film may be arranged around, i.e., so as to surround, the central portion of the protective film. The substrate may be attached to the front surface of the protective sheeting in the central portion of the protective film.

The holding frame may be attached to the front surface or the back surface of the protective sheeting in the same manner as detailed above for attaching the holding frame to the back surface of the protective film or sheeting.

The first side of the substrate or the second side of the substrate may be attached to the front surface of the protective sheeting in the same manner as detailed above for attaching the first or second side of the substrate to the front surface of the protective film.

In particular, attaching the first side of the substrate or the second side of the substrate to the front surface of the protective sheeting may comprise applying the protective sheeting to the first side of the substrate or the second side of the substrate, so that at least a central area of the front surface of the protective sheeting is in direct contact with the first side of the substrate or the second side of the substrate. In this case, no material, in particular, no adhesive, is present between at least the central area of the front surface of the protective sheeting and the first side of the substrate or the second side of the substrate. The central area of the front surface of the protective sheeting may correspond to a device area of the substrate.

The protective sheeting may be applied to the first side of the substrate or the second side of the substrate so that, in the entire region where the front surface of the protective sheeting is in contact with the first side of the substrate or the second side of the substrate, the front surface of the protective sheeting is in direct contact with the first side of the substrate or the second side of the substrate. Thus, no material, in particular, no adhesive, is present between the front surface of the protective sheeting and the first side of the substrate or the second side of the substrate.

Attaching the first side of the substrate or the second side of the substrate to the front surface of the protective sheeting may further comprise applying an external stimulus to the protective sheeting during and/or after applying the protective sheeting to the first side of the substrate or the second side of the substrate, so that the first side of the substrate or the second side of the substrate is attached to the front surface of the protective sheeting, in the same manner as detailed above for attaching the first or second side of the substrate to the front surface of the protective film.

The protective sheeting may be provided with an adhesive layer. The adhesive layer may be provided only in a peripheral area of the front surface of the protective sheeting. The peripheral area of the front surface of the protective sheeting may be arranged so as to surround the central area of the front surface of the protective sheeting.

The first side of the substrate or the second side of the substrate may be attached to the front surface of the protective sheeting so that the adhesive layer comes into contact only with a peripheral portion of the first side of the substrate or the second side of the substrate. The peripheral portion of the first or second side of the substrate may be or correspond to a peripheral marginal area of the substrate.

The adhesive layer may have the properties, characteristics and features described in detail above.

The substrate may be processed from the side of the substrate which is opposite the side of the substrate attached to the front surface of the protective sheeting and/or from the side of the substrate which is attached to the front surface of the protective sheeting in the same manner as detailed above.

The external stimulus and the process of applying the external stimulus to the protective sheeting may have the properties, characteristics and features described in detail above.

In the present method of the invention, attaching the holding frame to the front surface or the back surface of the protective sheeting comprises applying the protective sheeting to the holding frame, so that the front surface or the back surface of the protective sheeting is in direct contact with the holding frame. Thus, no material, in particular, no adhesive, is present between the front surface or the back surface of the protective sheeting and the holding frame.

In this way, the risk of a possible contamination of or damage to the holding frame, e.g., due to an adhesive force of an adhesive layer or adhesive residues on the holding frame, can be reliably eliminated.

The entire front surface and/or back surface of the protective sheeting may be free of adhesive.

Attaching the holding frame to the front surface or the back surface of the protective sheeting further comprises applying an external stimulus to the protective sheeting during and/or after applying the protective sheeting to the holding frame, so that the holding frame is attached to the front surface or the back surface of the protective sheeting.

By applying the external stimulus in this manner, an attachment force between protective sheeting and holding frame, holding the protective sheeting in its position on the holding frame, is generated. Hence, no additional adhesive material is necessary for attaching the protective sheeting to the holding frame.

In particular, by applying the external stimulus to the protective sheeting, a form fit, such as a positive fit, and/or a material bond, such as an adhesive bond, may be formed between the protective sheeting and the holding frame. The terms "material bond" and "adhesive bond" define an attachment or connection between protective sheeting and holding frame due to atomic and/or molecular forces acting between these two components.

Therefore, the present invention provides a further simple and efficient method of processing a substrate.

In particular, when detaching the holding frame from the protective sheeting, any damage to the frame by the adhesive force of an adhesive layer or any contamination of the frame by adhesive residues are reliably avoided. Hence, no adhesive residues have to be removed from the holding frame in order to allow for the frame to be reused, thus further enhancing the efficiency of substrate processing.

The holding frame and the substrate may be attached to the same surface of the protective sheeting, i.e., to the front surface of the protective sheeting.

Alternatively, the holding frame and the substrate may be attached to opposite surfaces of the protective sheeting. Specifically, the holding frame may be attached to the back surface of the protective sheeting.

The method may further comprise providing and using a support member as detailed above.

The method may further comprise providing and using a supporting means as detailed above.

The method may further comprise providing and using an inspection device as detailed above.

The protective sheeting may be expandable. The protective sheeting may be expanded when being applied to the first or second side of the substrate. If protrusions are present on the respective side of the substrate, the protective sheeting may be expanded when being applied to the side of the substrate so as to closely or at least partly follow the contours of these protrusions.

In particular, the protective sheeting may be expandable to twice its original size or more, preferably three times its original size or more and more preferably four times its original size or more. In this way, in particular, for the case of an expansion to three or four times its original size or more, it can be reliably ensured that the protective sheeting follows the contours of the protrusions.

If the protective sheeting is expandable it may be used for separating devices formed on the substrate from each other. In particular, the method may further comprise, after processing the substrate, radially expanding the protective sheeting so as to separate the devices from each other.

For example, the substrate may be fully divided, e.g., by a mechanical cutting process, a laser cutting process and/or a plasma cutting process, or by a dicing before grinding process. Subsequently, the fully divided devices, which may be in the form of chips or dies, may be moved away from each other by radially expanding the protective sheeting, thereby increasing the distances between adjacent devices.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods of processing a substrate.

In the following, a first embodiment of the present invention will be described with reference to FIGS. 1 and 2.

Figure 1:
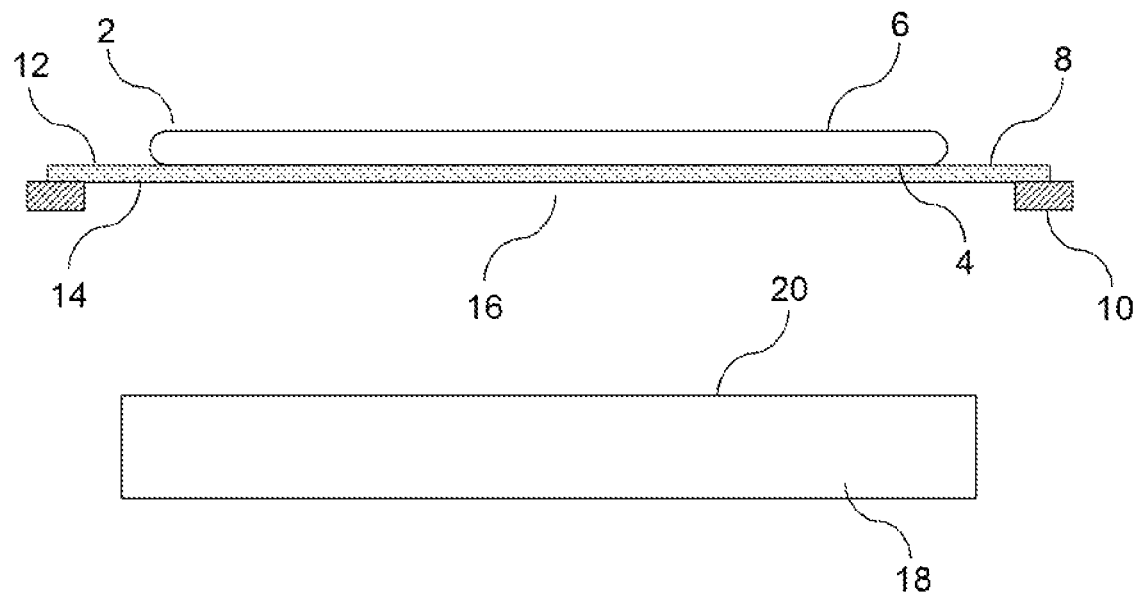
FIG. 1 is a cross-sectional view illustrating a step of placing a substrate held by a holding frame via a protective film on a support member in a method according to a first embodiment of the present invention.
Figure 2:
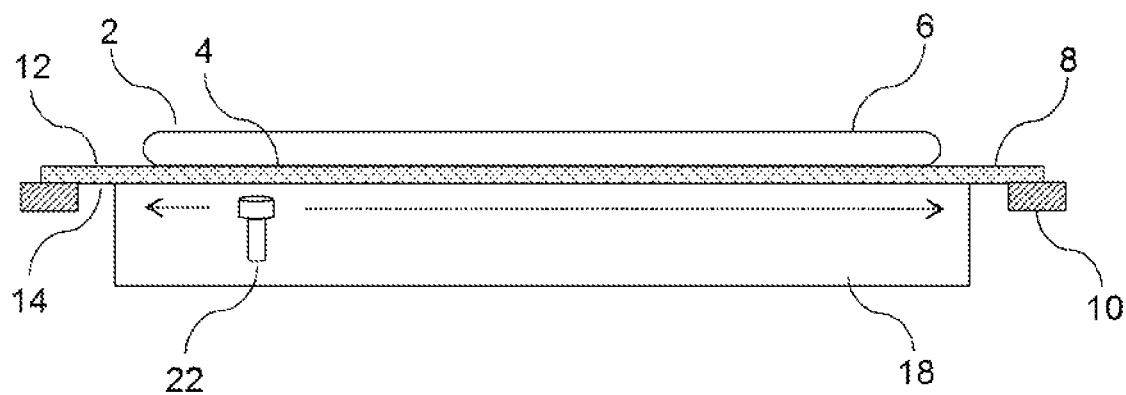
FIG. 2 is a cross-sectional view illustrating a step of inspecting a side of the substrate which is attached to the protective film by means of an inspecting device in the method according to the first embodiment of the present invention.

In the first embodiment, the method of the invention is performed on a substrate 2 (see FIGS. 1 and 2). The substrate 2 may be a wafer, such as a semiconductor wafer. However, different types of substrate and, in particular, different substrate materials may be used, as has been detailed above.

As is shown in FIG. 1, the substrate 2 has a first surface or first side 4, i.e., a front surface or front side, and a second surface or second side 6, i.e., a back surface or back side, opposite the first side 4. The first side 4 and the second side 6 are substantially parallel to each other.

On the first side 4 of the substrate 2, a device area (not shown) with a plurality of devices is formed. The devices are partitioned by a plurality of division lines (not shown) which are also formed on the first side 4. The division lines may be at least substantially arranged in a lattice pattern. In the present embodiment, the substrate 2 exhibits a substantially circular shape. However, the shape of the substrate 2 is not particularly limited. In other embodiments, the substrate 2 may have, for example, an oval shape, an elliptical shape or a polygonal shape, such as a rectangular shape or a square shape.

A protective film 8 and a holding frame 10 are provided (see FIGS. 1 and 2). The protective film 8 has a front surface 12 and a back surface 14 opposite the front surface 12. The holding frame 10 is configured for holding the substrate 2 via the protective film 8. The holding frame 10 has a central opening 16.

The holding frame 10 is made of a rigid material, such as a metal or a plastic. In the present embodiment, the holding frame 10 is an annular frame with a substantially circular central opening 16. The holding frame 10 may be a semiconductor-sized holding frame. However, any type of shape may be used for the holding frame 10 and the central opening 16. For example, in other embodiments, the holding frame 10 may have a polygonal shape, such as a square or rectangular shape. The central opening 16 may have a polygonal shape, such as a square or rectangular shape. The holding frame 10 may have a thickness in the range of 1 nm to 5 mm.

In the present embodiment, the protective film 8 is made of a single material, such as a polymer material, preferably a polyolefin, e.g., polyethylene (PE), polypropylene (PP) or polybutylene (PB). The protective film 8 may be heat resistant up to a temperature of 180° C. or more. The protective film 8 is expandable. The protective film 8 may have a thickness in the range of 5 to 200 Um, preferably in the range of 80 to 150 μm. The protective film 8 has a substantially circular shape in a top view thereon. However, the shape of the protective film 8 is not particularly limited. In other embodiments, the protective film 8 may have, for example, an oval shape, an elliptical shape or a polygonal shape, such as a rectangular shape or a square shape, in a top view thereon.

The protective film 8 has an outer diameter which is larger than an outer diameter of the substrate 2 and larger than an inner diameter of the holding frame 10, i.e., a diameter of the central opening 16 (see FIG. 1). An outer peripheral portion of the protective film 8 is attached to the holding frame 10, as will be detailed below.

In the present embodiment, the front surface 12 and the back surface 14 of the protective film 8 are free of adhesive.

The protective film 8 is applied to the holding frame 10 so that the back surface 14 of the protective film 8 is in direct contact with the holding frame 10, i.e., so that no material, in particular, no adhesive, is present between the back surface 14 and the holding frame 10. During and/or after applying the protective film 8 to the holding frame 10, an external stimulus is applied to the protective film 8, so that the holding frame 10 is attached to the back surface 14 of the protective film 8. By applying the external stimulus, an attachment force between protective film 8 and holding frame 10, holding the protective film 8 in its position on the holding frame 10, is generated. The holding frame 10 is attached to the back surface 14 of the protective film 8 so as to close the central opening 16 of the holding frame 10 by the protective film 8, as is shown in FIG. 1.

The external stimulus may be as detailed above. The external stimulus may be applied to the protective film 8 in the manner described above.

For example, applying the external stimulus to the protective film 8 may comprise or consist of heating the protective film 8. The protective film 8 may be directly and/or indirectly heated.

The protective film 8 may be heated by directly applying heat thereto, e.g., using a heat application means (not shown), such as a heated roller, a heated stamp or the like, or a heat radiation means (not shown). The protective film 8 and the holding frame 10 may be placed in a receptacle or chamber (not shown), such as a vacuum chamber, and an inner volume of the receptacle or chamber may be heated, so as to heat the protective film 8. The receptacle or chamber may be provided with a heat radiation means.

The protective film 8 may be indirectly heated, e.g., by heating the holding frame 10 before and/or during and/or after applying the protective film 8 to the holding frame 10. For example, the holding frame 10 may be heated by placing the holding frame 10 on a support or carrier (not shown) and heating the support or carrier.

In other embodiments, the holding frame 10 may be attached to the back surface 14 of the protective film 8 by means of an adhesive. The adhesive may be applied to the holding frame 10 and/or to the back surface 14 of the protective film 8 before attaching the holding frame 10 to the protective film 8. Preferably, the adhesive may be applied only to a portion of the back surface 14 of the protective film, in particular, to a peripheral area of the back surface 14.

By attaching the holding frame 10 to the back surface 14 of the protective film 8 in this manner, a holding unit, comprising the protective film 8 and the holding frame 10, is formed.

After attaching the holding frame 10 to the back surface 14 of the protective film 8, the protective film 8 is applied to the first side 4 of the substrate 2 so that, in the entire region where the front surface 12 of the protective film 8 is in contact with the first side 4 of the substrate 2, the front surface 12 of the protective film 8 is in direct contact with the first side 4. Thus, no material, in particular, no adhesive, is present between the front surface 12 of the protective film 8 and the first side 4 of the substrate 2. The protective film 8 is applied to the first side 4 of the substrate 2 so as to cover the devices formed in the device area. Hence, these devices are reliably protected from damage and contamination during subsequent substrate processing, handling and transporting steps.

During and/or after applying the protective film 8 to the first side 4 of the substrate 2, an external stimulus is applied to the protective film 8 so that the first side 4 of the substrate 2 is attached to the front surface 12 of the protective film 8. By applying the external stimulus, an attachment force between protective film 8 and substrate 2, holding the protective film 8 in its position on the substrate 2, is generated.

The external stimulus may be as detailed above. The external stimulus may be applied to the protective film 8 in the manner described above.

For example, applying the external stimulus to the protective film 8 may comprise or consist of heating the protective film 8. The protective film 8 may be directly and/or indirectly heated.

The protective film 8 may be heated by directly applying heat thereto, e.g., using a heat application means (not shown), such as a heated roller, a heated stamp or the like, or a heat radiation means (not shown). The protective film 8 and the substrate 2 may be placed in a receptacle or chamber (not shown), such as a vacuum chamber, and an inner volume of the receptacle or chamber may be heated, so as to heat the protective film 8. The receptacle or chamber may be provided with a heat radiation means.

The protective film 8 may be indirectly heated, e.g., by heating the substrate 2 before and/or during and/or after applying the protective film 8 to the substrate 2. For example, the substrate 2 may be heated by placing the substrate 2 on a support member or carrier, such as a chuck table, and heating the support member or carrier.

In other embodiments, the substrate 2 may be attached to the front surface 12 of the protective film 8 by means of an adhesive. In this case, the protective film 8 may be provided with an adhesive layer which is arranged only in a peripheral area of the front surface 12 of the protective film 8, as has been detailed above. This peripheral area is arranged so as to surround a central area of the front surface 12 of the protective film 8 which is free of adhesive. The first side 4 of the substrate 2 is attached to the front surface 12 of the protective film 8 so that the adhesive layer comes into contact only with a peripheral portion of the first side 4.

The central area of the front surface 12 of the protective film 8 is in direct contact with the first side 4 of the substrate 2.

By attaching the first side 4 of the substrate 2 to the front surface 12 of the protective film 8, a substrate unit, comprising the protective film 8, the holding frame 10 and the substrate 2, is formed (see FIG. 1), greatly facilitating subsequent processing, handling and transport of the substrate 2.

A support member 18 having a continuous support surface 20 is provided (see FIG. 1). In the present embodiment, the support member 18 is a chuck table having a substantially circular cross-section in the plane of the support surface 20. An outer diameter of the support member 18 in the plane of the support surface 20 is smaller than the inner diameter of the holding frame 10.

Further, an inspection device 22 for inspecting the first side 4 of the substrate 2 is provided. The inspection device 22 is arranged within the support member 18, as is shown in FIG. 2. In the present embodiment, the inspection device 22 is a camera using visible light. The support member 18 is transparent for visible light, thus allowing the inspection device 22 to inspect the first side 4 of the substrate 2 through the support member 18. The inspection device 22 is movable relative to the support member 18 in directions parallel to the support surface 20, as is indicated by dotted arrows in FIG. 2.

Prior to processing the substrate 2, the substrate unit is placed on the support surface 20 of the support member 18, so that the back surface 14 of the protective film 8 is in contact with the support surface 20 (see FIG. 2). Thus, the substrate 2 is arranged on the support member 18 so that the second side 6 of the substrate 2 is exposed, i.e., faces upward. Hence, the substrate 2 can be processed from the second side 6 in a particularly simple and efficient manner. The entire substrate 2 rests on the support surface 20, with the protective film 8 being arranged between substrate 2 and support surface 20. The substrate 2 is processed while it is placed on the support surface 20.

As has been detailed above, the holding frame 10 and the substrate 2 are attached to opposite sides of the protective film 8, i.e., to the back surface 14 and the front surface 12, respectively. Therefore, as is shown in FIG. 2, the holding frame 10 is arranged below the first side 4 of the substrate 2 which is placed on the support surface 20. Hence, it can be reliably ensured that the holding frame 10 does not interfere with processing the substrate 2 from its second side 6. The substrate 2 can be accessed freely by processing equipment, such as cutting, grinding, etching and polishing means. Further, any risk of this equipment being damaged due to unintentional contact with the holding frame 10 can be reliably eliminated.

Therefore, no clamping down of the holding frame 10 during substrate processing is required, so that the substrate 2 can be processed in a particularly simple and efficient manner. Since, thus, no clamp down mechanism is needed, the method of the invention allows for substrate processing within limited processing space. For example, rather than space consuming in-line equipment, stand-alone processing apparatuses can be used for this purpose.

In some embodiments, a supporting means (not shown) for supporting the holding frame 10 may be provided. The supporting means may be arranged, for example, around the circumference of the support member 18. The supporting means may be configured to support the holding frame 10 from below so as to hold it in its position relative to the support member 18. For example, the supporting means may be a substantially annular support table on which the holding frame 10 rests.

After placing the substrate unit on the support surface 20 of the support member 18, the first side 4 of the substrate 2 is inspected by means of the inspection device 22 through the support member 18 and the protective film 8. In particular, the division lines formed on the first side 4 are detected by the inspection device 22. For this purpose, the inspection device 22 may be moved relative to the support member 18 in directions parallel to the support surface 20 (see the dotted arrows in FIG. 2). Based on this detection process, the substrate 2 is aligned for subsequent processing thereof.

In the method of the present embodiment, the front surface 12 of the protective film 8 is in direct contact with the first side 4 of the substrate 2. Thus, no material, in particular, no adhesive, is present between the front surface 12 of the protective film 8 and the first side 4, as has been detailed above. Due to the absence of such material, in particular, an adhesive, the division lines formed on the first side 4 can be detected through the protective film 8 with a particularly high degree of precision.

After aligning the substrate 2 in this manner, the substrate 2 is processed, as will be further detailed below.

First, the second side 6 of the substrate 2 is ground to adjust the substrate thickness. Since the holding frame 10 is attached to the back surface 14 of the protective film 8, the grinding process can be performed in a simple and efficient manner, without any risk of damage to the grinding equipment (not shown) due to unintentional contact with the holding frame 10.

The grinding process may be optionally followed by polishing and/or etching the second side 6 of the substrate 2. The process of polishing the second side 6 may comprise or consist of chemical mechanical polishing (CMP), dry polishing (DP) and/or other types of polishing processes. The etching process may comprise or consist of a plasma etching process. Also the polishing and/or etching processes can be carried out in a simple and efficient manner, without any risk of damage to the processing equipment used (not shown) due to unintentional contact with the holding frame 10.

After grinding, and optionally polishing and/or etching, the second side 6 of the substrate 2, the substrate 2 is cut from the second side 6. In the present embodiment, the substrate 2 is cut along the division lines formed on the first side 4 of the substrate 2. This cutting process can be performed with a high degree of accuracy since the division lines have been detected by the inspection device 22, as has been detailed above.

The substrate 2 may be cut from its second side 6 by mechanical cutting, e.g., by blade dicing or sawing, and/or by laser cutting and/or by plasma cutting, as has been detailed above. The substrate 2 may be cut in a single mechanical cutting step, a single laser cutting step or a single plasma cutting step. Alternatively, the substrate 2 may be cut by a sequence of mechanical cutting and/or laser cutting and/or plasma cutting steps. Laser cutting may be performed, for example, by ablation laser cutting and/or by stealth laser cutting, i.e., by forming modified regions within the substrate 2 by the application of a laser beam (not shown) and/or by forming a plurality of hole regions in the substrate 2 by the application of a laser beam.

The substrate 2 may be fully cut, i.e., cut along its entire thickness, along the division lines. In this case, the substrate 2 is divided along the division lines into a plurality of chips or dies comprising the devices of the device area. Subsequently, the fully divided chips or dies may be moved away from each other by radially expanding the protective film 8, thereby increasing the distances between adjacent chips or dies.

Alternatively, the substrate 2 may be cut along only part of its thickness. In this case, a process of dividing, i.e., fully dividing, the substrate 2 may be carried out, for example, by adopting a breaking process, applying an external force to the substrate 2, e.g., using an expansion tape (not shown), or by adopting a further cutting or dicing process, such as a mechanical cutting or dicing process, a laser cutting or dicing process or a plasma cutting or dicing process. For example, an external force may be applied to the substrate 2 by radially expanding the protective film 8, i.e., by using the protective film 8 as an expansion tape. Further, also a combination of two or more of these processes may be employed.

Due to the arrangement of the holding frame 10 on the back surface 14 of the protective film 8, the cutting process can be performed in a simple and efficient manner, without any risk of damage to the cutting equipment (not shown) due to unintentional contact with the holding frame 10.

In addition or as an alternative, in some embodiments, the substrate 2 may be processed, e.g., cut, from the first side 4 of the substrate 2 which is attached to the front surface 12 of the protective film 8, as will be further detailed below for the fifth embodiment of the method of the present invention.

After dividing the substrate 2 in the cutting process, the resulting chips or dies can be picked up from the protective film 8, e.g., by using a pick-up device (not shown). Since no adhesive is present between the front surface 12 of the protective film 8 and the chips or dies, as has been detailed above, the chips or dies can be picked up in a particularly simple and efficient manner. In order to even further simplify the pick-up process, the protective film 8 can be radially expanded so as to increase the distances between adjacent chips or dies.

As follows from the explanations given above, all of the steps of processing the substrate 2 can be performed while the substrate 2 is held by the holding frame 10 via the protective film 8. Thus, only one step of mounting the substrate 2 to a frame is required. The substrate unit, comprising the protective film 8, the holding frame 10 and the substrate 2, enables reliable and safe processing, handling and transport of the substrate 2. Hence, no space consuming in-line equipment is required for secure substrate transport and handling, but stand-alone processing apparatuses can be used for this purpose. Thus, the substrate processing method can be carried out in a particularly simple and efficient manner.

For example, conventionally, a transportation pad is used for transporting the substrate 2 after grinding or after polishing and/or etching. The transportation pad partially or fully contacts the ground or polished substrate surface, thus causing contamination issues. Such problems can be reliably avoided by the present method in which the substrate 2 is handled and transported via the holding frame 10 throughout processing.

In the first embodiment, the protective film 8 constitutes a protective sheeting which consists only of the protective film 8. However, in other embodiments, a protective sheeting may be used which consists of or comprises the protective film 8 and a cushioning layer (not shown) or which consists of or comprises the protective film 8, a cushioning layer and a base sheet (not shown), as has been detailed above. Such protective sheetings may be used in the same manner as detailed above for the protective film 8 in the method of the first embodiment. Embodiments of the present invention in which a protective sheeting is used which consists of the protective film 8 and a cushioning layer or which consists of the protective film 8, a cushioning layer and a base sheet will be discussed in further detail below with reference to FIGS. 9 to 12.

In the first embodiment, the first side 4 of the substrate 2 is attached to the front surface 12 of the protective film 8. However, in other embodiments, the second side 6 of the substrate 2 may be attached to the front surface 12 of the protective film 8.

Figure 3:
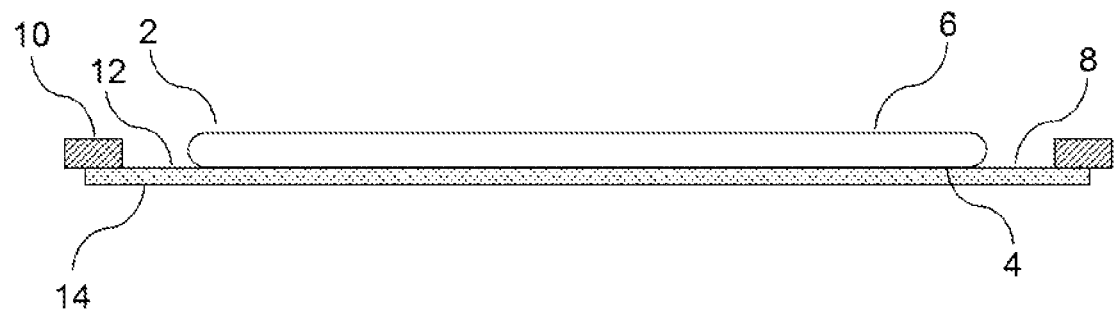
FIG. 3 is a cross-sectional view showing a substrate held by a holding frame via a protective film in a method according to a second embodiment of the present invention.

In the following, a second embodiment of the present invention will be described with reference to FIG. 3.

The method of the second embodiment differs from the method of the first embodiment only in that the holding frame 10 is attached to the front surface 12 of the protective film 8, i.e., to the same side of the protective film 8 as the substrate 2.

The holding frame 10 is attached to the front surface 12 of the protective film 8 in the same manner as detailed for the first embodiment above for attaching the holding frame 10 to the back surface 14 of the protective film 8.

Specifically, the protective film 8 is applied to the holding frame 10 so that the front surface 12 of the protective film 8 is in direct contact with the holding frame 10, i.e., so that no material, in particular, no adhesive, is present between the front surface 12 and the holding frame 10. During and/or after applying the protective film 8 to the holding frame 10, an external stimulus is applied to the protective film 8, so that the holding frame 10 is attached to the front surface 12 of the protective film 8. By applying the external stimulus, an attachment force between protective film 8 and holding frame 10, holding the protective film 8 in its position on the holding frame 10, is generated. The holding frame 10 is attached to the front surface 12 of the protective film 8 so as to close the central opening 16 of the holding frame 10 by the protective film 8, as is shown in FIG. 3.

The external stimulus may be as detailed above. The external stimulus may be applied to the protective film 8 in the manner described above. For example, applying the external stimulus to the protective film 8 may comprise or consist of heating the protective film 8. The protective film 8 may be directly and/or indirectly heated, as has been detailed above for the first embodiment.

Since an attachment force between protective film 8 and holding frame 10 is generated by applying the external stimulus, no additional adhesive material is necessary for attaching the protective film 8 to the holding frame 10. Further, when detaching the holding frame 10 from the protective film 8, any damage to the holding frame 10 by the adhesive force of an adhesive layer or any contamination of the holding frame 10 by adhesive residues are reliably avoided. Hence, no adhesive residues have to be removed from the holding frame 10 in order to allow for the holding frame 10 to be reused.

Therefore, also the second embodiment provides a simple and efficient method of processing the substrate 2.

The method of the second embodiment may be modified in the same manner as detailed above for the first embodiment.

Figure 4:
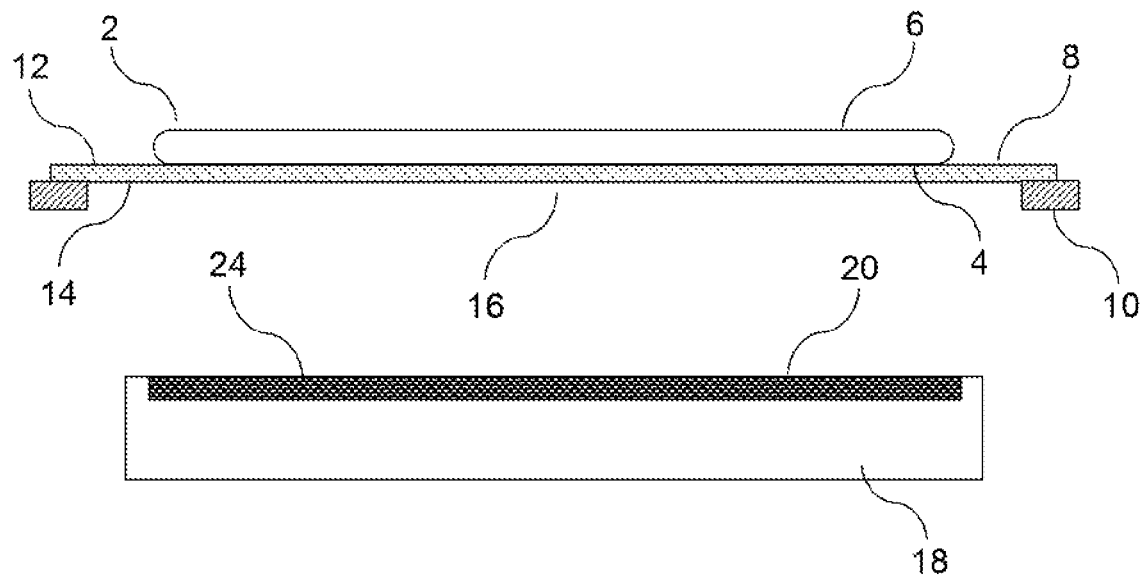
FIG. 4 is a cross-sectional view illustrating a step of placing a substrate held by a holding frame via a protective film on a support member in a method according to a third embodiment of the present invention.

In the following, a third embodiment of the present invention will be described with reference to FIGS. 4 to 6.

The method of the third embodiment differs from the method of the first embodiment only in that a different type of support member 18 is used. In particular, the support member 18 of the third embodiment is provided with a holding means (not shown) for holding the substrate 2 on the support surface 20. The support member 18 has an air permeable portion 24 (see FIG. 4) which allows for the passage of air therethrough. For example, the air permeable portion 24 may be made of a porous ceramic. The holding means is a suction means for holding the substrate 2 on the support surface 20 under suction through the air permeable portion 24.

In known methods, protective films are often used having a diameter which is approximately the same as that of the substrate 2 and smaller than that of the air permeable portion 24. Thus, contaminants, such as grinding or cutting water and grinding or polishing dust, can enter into the air permeable portion 24 through a gap between the outer circumferences of the protective film and the air permeable portion 24. Such contaminants may clog the air permeable portion 24, e.g., pores provided therein, and thus considerably affect the suction holding of the substrate 2. Further, the resulting need to frequently clean the air permeable portion 24 significantly reduces the efficiency of substrate processing.

If a smaller diameter of the air permeable portion 24 is chosen in order to avoid the above-identified problem, the suction force achievable by suction through the air permeable portion 24 may not be sufficient for reliably and securely holding the substrate 2 in its position on the support surface 20 during substrate processing, in particular, at the outer edge of the substrate 2.

Conventionally, it has been tried to overcome the above problems by attaching the protective film to a frame and clamping down the frame during processing, in particular, grinding, of the substrate 2. However, this known approach entails the issues already discussed in detail above. In particular, the use of a clamp down mechanism is required which is space consuming and renders substrate processing considerably more cumbersome and complicated. Moreover, the protective film must exhibit a high degree of expandability for enabling sufficient clamping down of the frame, thus significantly limiting the range of usable protective films.

Also, in order to allow the required amount of movement of the frame relative to the substrate 2 during the clamping down process, a sufficiently large portion of the protective film has to be present between an inner circumference of the frame and an outer circumference of the substrate. Hence, a frame with a large inner diameter has to be used, thereby aggravating the above space consumption problem and restricting the range of usable frames.

The above-identified problems have been solved by the present invention.

Figure 5:
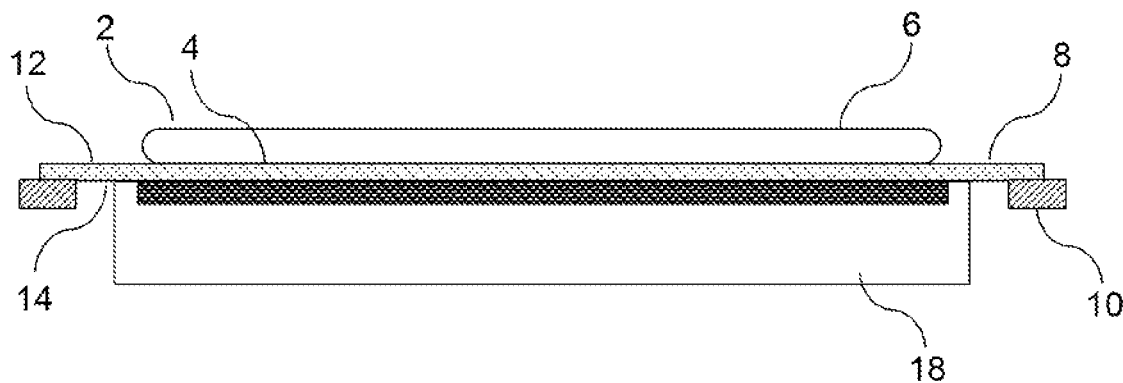
FIG. 5 is a cross-sectional view showing the outcome of the step illustrated in FIG. 4.

In particular, as is shown in FIG. 5, the protective film 8 can be chosen so as to have a diameter which is sufficiently large to cover the entire air permeable portion 24, thereby reliably avoiding the entry of contaminants therein. Thus, no restrictions concerning the diameter of the air permeable portion 24 apply. According to the present invention, despite the use of a protective film 8 with a large diameter and a holding frame 10, no clamping down of the holding frame 10 is required since the holding frame 10 and the substrate 2 are attached to opposite sides of the protective film 8 (see FIGS. 4 and 5). Hence, as no clamp down mechanism is needed, the method of the invention allows for substrate processing within limited processing space.

Figure 6:
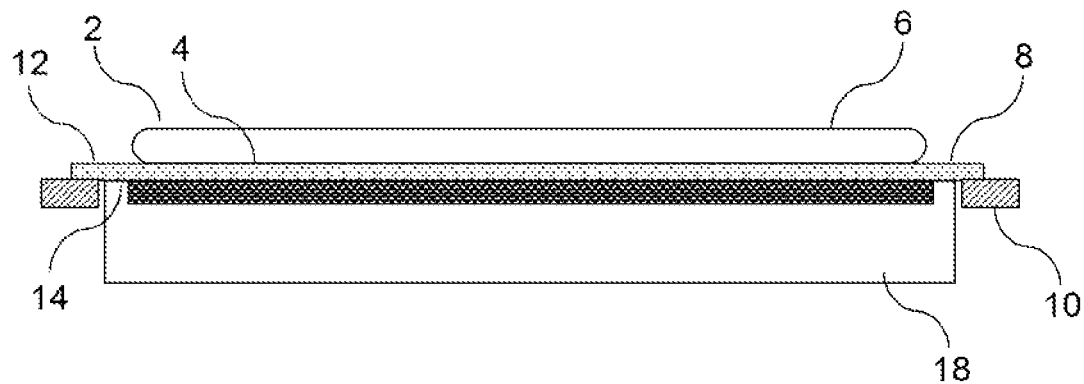
FIG. 6 is a cross-sectional view showing the outcome of the step illustrated in FIG. 4 for a modification of the method according to the third embodiment of the present invention.

Moreover, in the method of the invention, the required processing space can be reduced even further, as is illustrated by the modification of the third embodiment shown in FIG. 6. Since no clamping down of the holding frame 10 is required, the holding frame 10 does not have to be moved downwards relative to the support surface 20. Therefore, it is fully sufficient if only a small portion of the protective film 8 is present between the inner circumference of the holding frame 10 and the outer circumference of the substrate 2. Hence, as compared to the method of the third embodiment illustrated in FIGS. 4 and 5, a holding frame 10 with even smaller inner and outer diameters can be used, as is shown in FIG. 6. In this way, more space in the region around the support member 18 can be saved.

Further, also the diameter of the support member 18 itself can be minimised.

The method of the third embodiment may be modified in the same manner as detailed above for the first embodiment.

Figure 7:
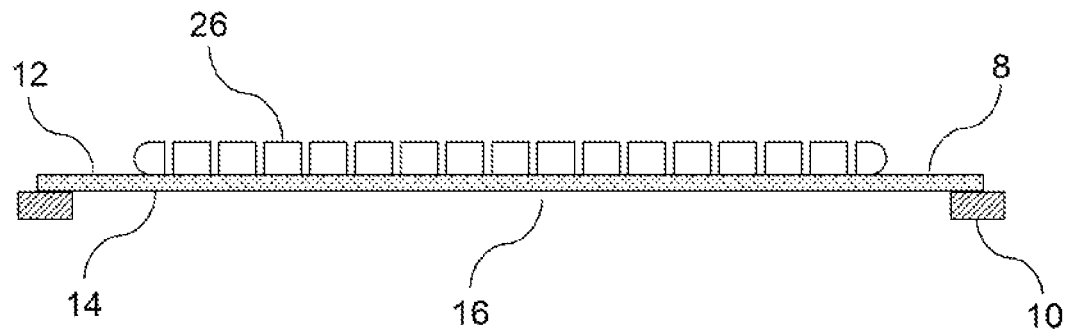
FIG. 7 is a cross-sectional view showing the outcome of a step of dividing a substrate in a method according to a fourth embodiment of the present invention.

In the following, a fourth embodiment of the present invention will be described with reference to FIG. 7. The method of the fourth embodiment differs from the method of the first embodiment only in that the substrate 2 is fully divided by a dicing before grinding process. Specifically, before attaching the first side 4 of the substrate 2 to the front surface 12 of the protective film 8, the substrate 2 is partially cut, i.e., cut along only part of its thickness, from the first side 4 along the division lines. Subsequently, the first side 4 is attached to the front surface 12 of the protective film 8 and the second side 6 is ground along a remaining part of the thickness of the substrate 2 in which no substrate material has been removed in the partial cutting process. In this way, the substrate 2 is divided along the division lines into a plurality of chips or dies 26 (see FIG. 7).

Optionally, the second side 6 of the divided substrate 2 may be polished after grinding. Polishing the second side 6 may comprise or consist of chemical mechanical polishing (CMP), dry polishing (DP) and/or other types of polishing processes.

After dividing the substrate 2, the resulting chips or dies 26 can be picked up from the protective film 8, e.g., by using a pick-up device. Since no adhesive is present between the front surface 12 of the protective film 8 and the chips or dies 26, the chips or dies 26 can be picked up in a particularly simple and efficient manner. In order to even further simplify the pick-up process, the protective film 8 can be radially expanded so as to increase the distances between adjacent chips or dies 26.

The method of the fourth embodiment may be modified in the same manner as detailed above for the first embodiment.

In the following, a fifth embodiment of the present invention will be described with reference to FIG. 8.

The method of the fifth embodiment differs from the method of the first embodiment only in that the substrate 2 is processed from its first side 4. The substrate 2 is placed on the support surface 20 of the support member 18 so that the second side 6 of the substrate 2 is in contact with the support surface 20 (see FIG. 8). Thus, the substrate 2 is arranged on the support member 18 so that the first side 4 of the substrate 2 faces upward.

Figure 8:
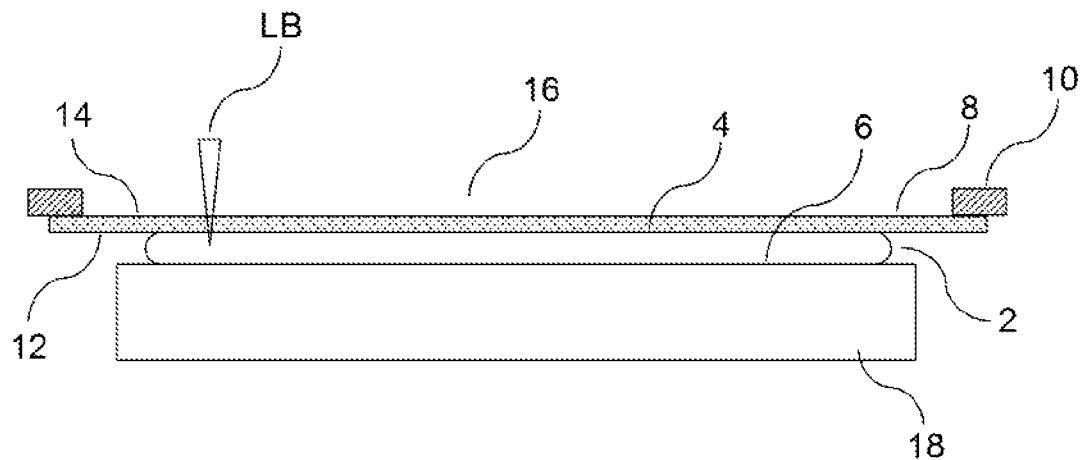
FIG. 8 is a cross-sectional view illustrating a step of processing a substrate in a method according to a fifth embodiment of the present invention.

As is illustrated in FIG. 8, the substrate 2 is subjected to a stealth laser cutting process through the protective film 8. In this process, a laser beam LB having a wavelength that allows transmission of the laser beam LB through the protective film 8 and through the substrate 2 is applied to the substrate 2 so as to form a plurality of modified regions (not shown) in the substrate 2, as has been detailed above.

The modified regions are formed along the division lines, thus reducing the strength of the substrate 2 along the division lines.

The laser beam LB may be a pulsed laser beam. The pulsed laser beam may have a pulse width, for example, in the range of 1 fs to 1000 ns.

The method may further comprise, after forming the plurality of modified regions in the substrate 2, dividing the substrate 2 along the division lines. The process of dividing the substrate 2 may be carried out in various ways, e.g., by adopting a breaking process, applying an external force to the substrate 2, for example, using an expansion tape, or by adopting a cutting or dicing process, such as a mechanical cutting or dicing process, a laser cutting or dicing process or a plasma cutting or dicing process. For example, an external force may be applied to the substrate 2 by radially expanding the protective film 8, i.e., by using the protective film 8 as an expansion tape. Further, also a combination of two or more of these processes may be employed.

The method of the fifth embodiment may be modified in the same manner as detailed above for the first embodiment.

In the following, a sixth embodiment of the present invention will be described with reference to FIG. 9.

The method of the sixth embodiment substantially differs from the method of the first embodiment only in that a different type of protective sheeting is used. Specifically, the protective sheeting used in the method of the sixth embodiment consists of the protective film 8 and a cushioning layer 28 (see FIG. 9). The cushioning layer 28 is attached to the back surface 14 of the protective film 8.

Protrusions and/or recesses (not shown) present on the first side 4 of the substrate 2 can be embedded in the cushioning layer 28. Hence, any negative influence of the surface unevenness arising from the presence of the protrusions and/or recesses on subsequent substrate processing steps, such as cutting, grinding and/or polishing, can be eliminated. In particular, the cushioning layer 28 can significantly contribute to achieving a particularly uniform and homogeneous distribution of pressure, e.g., during a cutting, grinding and/or polishing process.

The cushioning layer 28 may have the features, properties and characteristics described in detail above.

The material of the cushioning layer 28 is not particularly limited. In particular, the cushioning layer 28 may be formed of any type of material which allows for protrusions and/or recesses present on the first side 4 of the substrate 2 to be embedded therein. The cushioning layer 28 may be curable by an external stimulus, such as UV radiation, heat, an electric field and/or a chemical agent.

Figure 9:
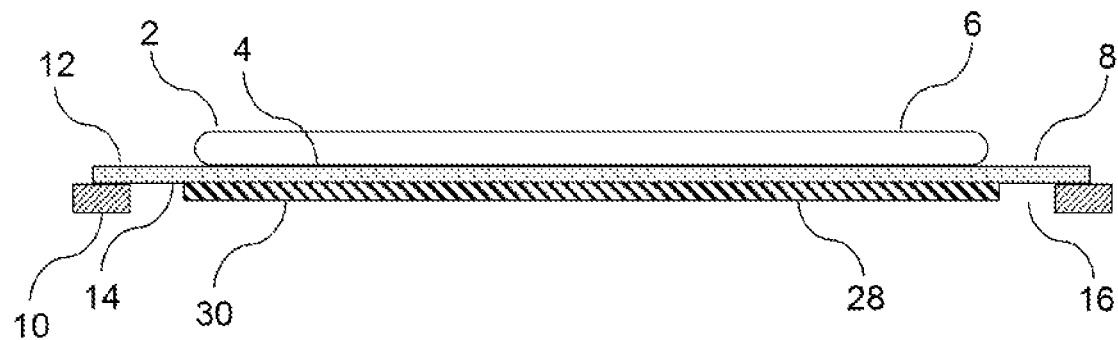
FIG. 9 is a cross-sectional view showing a substrate held by a holding frame via a protective sheeting in a method according to a sixth embodiment of the present invention.

As is shown in FIG. 9, the cushioning layer 28 has a diameter which is smaller than a diameter of the protective film 8. The cushioning layer 28 is only present in a central portion of the protective film 8 but not in a peripheral portion of the protective film 8. The peripheral portion of the protective film 8 is arranged around, i.e., so as to surround, the central portion of the protective film 8.

The holding frame 10 is attached to the back surface 14 of the protective film 8 in the peripheral portion of the protective film 8 (see FIG. 9). Hence, the cushioning layer 28 is not present between the holding frame 10 and the back surface 14 of the protective film 8 in the area where the holding frame 10 is attached to the back surface 14 of the protective film 8.

The substrate 2 is attached to the front surface 12 of the protective film 8 in the central portion of the protective film 8. The diameter of the cushioning layer 28 is slightly larger than a diameter of the substrate 2 (see FIG. 9). Thus, it can be particularly reliably ensured that protrusions and/or recesses present on the first side 4 of the substrate 2 are embedded in the cushioning layer 28.

The method of the sixth embodiment is performed substantially in the same manner as the method of the first embodiment.

Prior to processing the substrate 2, the substrate 2 having the protective sheeting attached thereto is placed on a support surface of a support member, such as the support member 18 (see FIGS. 1 and 2), so that a back surface 30 of the cushioning layer 28 (see FIG. 9) is in contact with the support surface. Thus, the substrate 2 is arranged on the support member so that the second side 6 of the substrate 2 is exposed, i.e., faces upward. Hence, the substrate 2 can be processed from the second side 6 in a particularly simple and efficient manner. The substrate 2 is processed while it is placed on the support surface.

The method of the sixth embodiment may be modified in the same manner as detailed above for the first embodiment.

Figure 10:
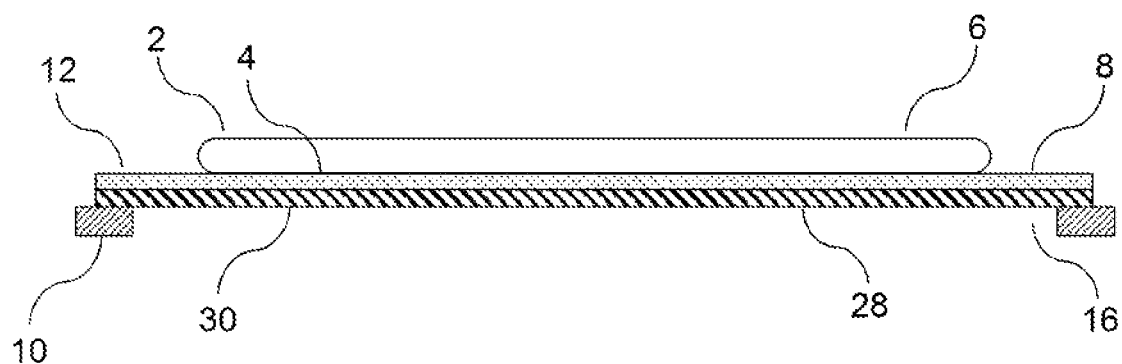
FIG. 10 is a cross-sectional view showing a substrate held by a holding frame via a protective sheeting in a method according to a seventh embodiment of the present invention.

In the following, a seventh embodiment of the present invention will be described with reference to FIG. 10.

The method of the seventh embodiment substantially differs from the method of the sixth embodiment only in the diameter of the cushioning layer 28. Specifically, in the method of the seventh embodiment, the diameter of the cushioning layer 28 is substantially the same as the diameter of the protective film 8. The back surface of the protective sheeting is thus formed by the back surface 30 of the cushioning layer 28. The holding frame 10 is attached to the back surface of the protective sheeting, i.e., to the back surface 30 of the cushioning layer 28, as is shown in FIG. 10.

The method of the seventh embodiment may be modified in the same manner as detailed above for the first embodiment.

In the following, an eighth embodiment of the present invention will be described with reference to FIG. 11.

The method of the eighth embodiment substantially differs from the method of the sixth embodiment only in that a base sheet 32 is attached to the back surface 30 (see FIG. 9) of the cushioning layer 28. The protective sheeting used in the method of the eighth embodiment thus consists of the protective film 8, the cushioning layer 28 and the base sheet 32 (see FIG. 11).

The base sheet 32 may have the features, properties and characteristics described in detail above.

The material of the base sheet 32 is not particularly limited. The base sheet 32 may be made of a soft or pliable material, such as, for example, a polymer material, e.g., polyvinyl chloride (PVC), ethylene vinyl acetate (EVA) or a polyolefin. Alternatively, the base sheet 32 may be made of a rigid or hard material, such as polyethylene terephthalate (PET) and/or silicon and/or glass and/or stainless steel (SUS).

Figure 11:
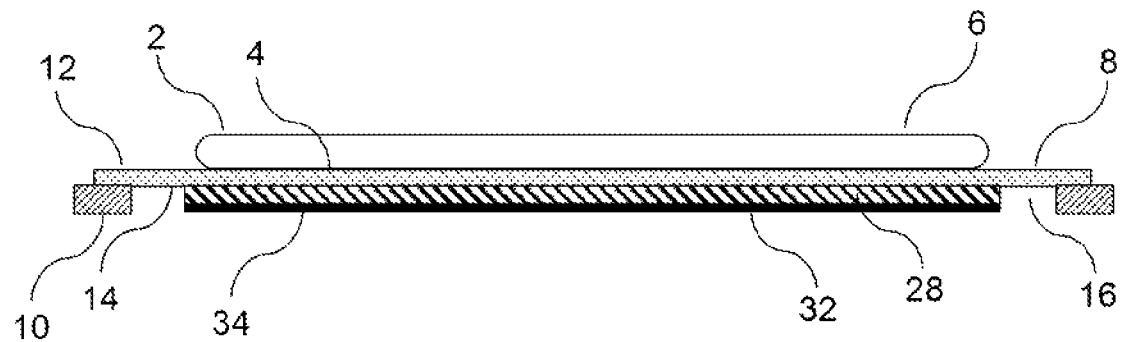
FIG. 11 is a cross-sectional view showing a substrate held by a holding frame via a protective sheeting in a method according to an eighth embodiment of the present invention.

As is shown in FIG. 11, the base sheet 32 has a diameter which is substantially the same as the diameter of the cushioning layer 28. Thus, the cushioning layer 28 and the base sheet 32 are only present in the central portion of the protective film 8 but not in the peripheral portion of the protective film 8.

The holding frame 10 is attached to the back surface 14 of the protective film 8 in the peripheral portion of the protective film 8 (see FIG. 11). Hence, the cushioning layer 28 and the base sheet 32 are not present between the holding frame 10 and the back surface 14 of the protective film 8 in the area where the holding frame 10 is attached to the back surface 14 of the protective film 8. The substrate 2 is attached to the front surface 12 of the protective film 8 in the central portion of the protective film 8.

The method of the eighth embodiment is performed substantially in the same manner as the method of the first embodiment.

Prior to processing the substrate 2, the substrate 2 having the protective sheeting attached thereto is placed on a support surface of a support member, such as the support member 18 (see FIGS. 1 and 2), so that a back surface 34 of the base sheet 32 (see FIG. 11) is in contact with the support surface. Thus, the substrate 2 is arranged on the support member so that the second side 6 of the substrate 2 is exposed. Hence, the substrate 2 can be processed from the second side 6 in a particularly simple and efficient manner. The substrate 2 is processed while it is placed on the support surface.

The method of the eighth embodiment may be modified in the same manner as detailed above for the first embodiment.

Figure 12:
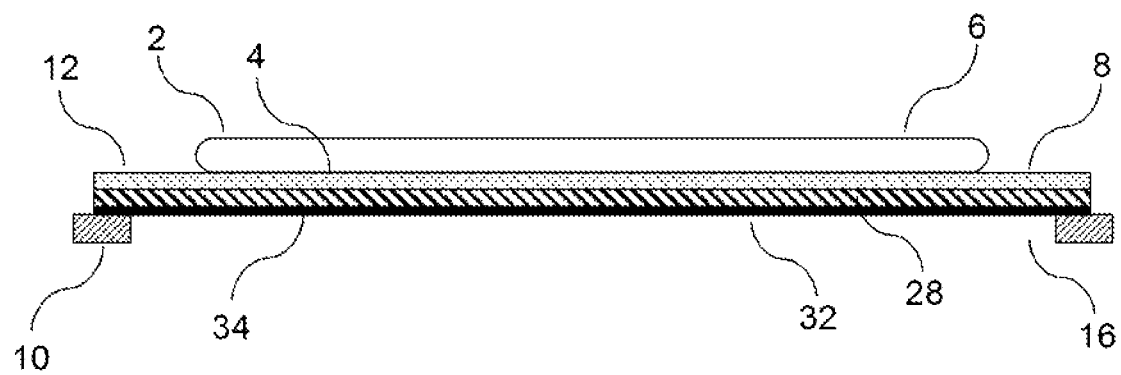
FIG. 12 is a cross-sectional view showing a substrate held by a holding frame via a protective sheeting in a method according to a ninth embodiment of the present invention.

In the following, a ninth embodiment of the present invention will be described with reference to FIG. 12.

The method of the ninth embodiment substantially differs from the method of the eighth embodiment only in the diameters of the cushioning layer 28 and the base sheet 32. Specifically, in the method of the ninth embodiment, the diameter of the cushioning layer 28 and the diameter of the base sheet 32 are substantially the same as the diameter of the protective film 8. The back surface of the protective sheeting is thus formed by the back surface 34 of the base sheet 32. The holding frame 10 is attached to the back surface of the protective sheeting, i.e., to the back surface 34 of the base sheet 32, as is shown in FIG. 12.

The method of the ninth embodiment may be modified in the same manner as detailed above for the first embodiment.

The invention claimed is:

1. A method of processing a substrate having a first side and a second side opposite the first side, the method comprising:
   providing a protective film having a front surface and a back surface opposite the front surface;
   providing a holding frame for holding the substrate, wherein the holding frame has a central opening and a body surrounding the central opening;
   attaching the holding frame to the back surface of the protective film so as to close the central opening of the holding frame by the protective film, so that the holding frame is arranged only on a back surface side of the protective film;
   attaching the first side of the substrate or the second side of the substrate to the front surface of the protective film so that the substrate is arranged on a front surface side of the protective film; and
   processing the substrate from the side of the substrate which is opposite the side of the substrate attached to the front surface of the protective film and/or processing the substrate from the side of the substrate which is attached to the front surface of the protective film.

2. The method according to claim 1, wherein attaching the first side of the substrate or the second side of the substrate to the front surface of the protective film comprises:
   applying the protective film to the first side of the substrate or the second side of the substrate, so that at least a central area of the front surface of the protective film is in direct contact with the first side of the substrate or the second side of the substrate.

3. The method according to claim 2, wherein attaching the first side of the substrate or the second side of the substrate to the front surface of the protective film further comprises:
   applying an external stimulus to the protective film during and/or after applying the protective film to the first side of the substrate or the second side of the substrate, so that the first side of the substrate or the second side of the substrate is attached to the front surface of the protective film.

4. The method according to claim 1, wherein attaching the holding frame to the back surface of the protective film comprises:
   applying the protective film to the holding frame, so that the back surface of the protective film is in direct contact with the holding frame, and
   applying an external stimulus to the protective film during and/or after applying the protective film to the holding frame, so that the holding frame is attached to the back surface of the protective film.

5. The method according to claim 3, wherein applying the external stimulus to the protective film comprises heating the protective film and/or cooling the protective film and/or applying a vacuum to the protective film and/or irradiating the protective film with light.

6. The method according to claim 1, wherein
   at least one division line is formed on the first side of the substrate, and
   the first side of the substrate is attached to the front surface of the protective film.

7. The method according to claim 1, further comprising:
   providing a support member having a support surface, and
   placing the substrate attached to the front surface of the protective film on the support surface of the support member, so that the back surface of the protective film is in contact with the support surface.

8. The method according to claim 1, further comprising:
   providing an inspection device, and
   inspecting the side of the substrate which is attached to the front surface of the protective film by means of the inspection device through the protective film.

9. The method according claim 1, wherein
   the protective film is provided with an adhesive layer,
   the adhesive layer is provided only in a peripheral area of the front surface of the protective film, and
   the first side of the substrate or the second side of the substrate is attached to the front surface of the protective film so that the adhesive layer comes into contact only with a peripheral portion of the first side of the substrate or the second side of the substrate.

10. The method according to claim 1, wherein
   the substrate is processed from the side of the substrate which is opposite the side of the substrate attached to the front surface of the protective film, and
   processing the substrate from the side of the substrate which is opposite the side of the substrate attached to the front surface of the protective film comprises cutting and/or grinding and/or polishing the substrate from the side of the substrate which is opposite the side of the substrate attached to the front surface of the protective film.

11. The method according to claim 1, wherein
   the substrate is processed from the side of the substrate which is attached to the front surface of the protective film, and
   processing the substrate from the side of the substrate which is attached to the front surface of the protective film comprises irradiating the substrate with radiation from the side of the substrate attached to the front surface of the protective film.

12. A method of processing a substrate having a first side and a second side opposite the first side, the method comprising:
   providing a protective sheeting having a front surface and a back surface opposite the front surface;
   providing a holding frame for holding the substrate, wherein the holding frame has a central opening;
   attaching the holding frame to the front surface or the back surface of the protective sheeting so as to close the central opening of the holding frame by the protective sheeting;
   attaching the first side of the substrate or the second side of the substrate to the front surface of the protective sheeting; and
   processing the substrate from the side of the substrate which is opposite the side of the substrate attached to the front surface of the protective sheeting and/or processing the substrate from the side of the substrate which is attached to the front surface of the protective sheeting,
   wherein attaching the holding frame to the front surface or the back surface of the protective sheeting comprises:

applying the protective sheeting to the holding frame, so that the front surface or the back surface of the protective sheeting is in direct contact with the holding frame, such that no adhesive is present between the front surface or the back surface of the protective sheeting and the holding frame; and applying an external stimulus to the protective sheeting during and/or after applying the protective sheeting to the holding frame, so that the holding frame is attached to the front surface or the back surface of the protective sheeting, wherein, by applying the external stimulus to the protective sheeting, a material bond or a material bond and a form fit is formed between the protective sheeting and the holding frame, the material bond being an attachment between the protective sheeting and the holding frame due to atomic and/or molecular forces acting between the protective sheeting and the holding frame.

* * * * *